United States Patent
Fong

(10) Patent No.: US 7,450,025 B2
(45) Date of Patent: *Nov. 11, 2008

(54) LEVEL/POSITION SENSOR AND RELATED ELECTRONIC CIRCUITRY FOR INTERACTIVE TOY

(76) Inventor: Peter Sui Lun Fong, 297F S. Atlantic Blvd., Monterey Park, CA (US) 91754

( * ) Notice: Subject to any disclaimer, the term of this patent is extended or adjusted under 35 U.S.C. 154(b) by 565 days.

This patent is subject to a terminal disclaimer.

(21) Appl. No.: 11/186,042

(22) Filed: Jul. 21, 2005

(65) Prior Publication Data

US 2005/0255786 A1 Nov. 17, 2005

Related U.S. Application Data

(63) Continuation-in-part of application No. 10/872,015, filed on Jun. 18, 2004, now Pat. No. 7,239,248, which is a continuation-in-part of application No. 10/628,007, filed on Jul. 25, 2003, now Pat. No. 6,995,680, and a continuation-in-part of application No. 10/179,569, filed on Jun. 25, 2002, now Pat. No. 6,909,374, which is a continuation of application No. 09/568,900, filed on May 11, 2000, now Pat. No. 6,437,703, which is a continuation-in-part of application No. 09/478,388, filed on Jan. 6, 2000, now Pat. No. 6,377,187.

(60) Provisional application No. 60/398,372, filed on Jul. 25, 2002.

(51) Int. Cl.
*G08B 21/00* (2006.01)

(52) U.S. Cl. .................. 340/686.1; 340/689; 340/573.1; 340/691.2; 200/52 R; 200/61.45 R; 200/61.52; 73/652; 73/654

(58) Field of Classification Search ............. 340/686.1, 340/689, 573.1, 691.2; 200/52 R, 61.52, 200/61.45 R, 61.48; 73/652, 654, 651, 653, 73/657, 655, 649; 434/311

See application file for complete search history.

(56) References Cited

U.S. PATENT DOCUMENTS

| | | |
|---|---|---|
| 3,460,028 A | 8/1969 | Beaver |
| 3,601,729 A | 8/1971 | Hierta |
| 4,321,438 A | 3/1982 | Emenegger |
| 4,339,747 A | 7/1982 | Maybee |
| 4,390,928 A | 6/1983 | Runge |
| 4,503,299 A | 3/1985 | Henrard |
| 4,644,662 A | 2/1987 | Anderson et al. |
| 4,651,613 A | 3/1987 | Harrison |
| 4,672,753 A | 6/1987 | Kent et al. |
| 4,700,479 A | 10/1987 | Saito et al. |
| 4,701,146 A * | 10/1987 | Swenson ............... 446/130 |
| 4,803,342 A | 2/1989 | Steers et al. |
| 4,811,492 A | 3/1989 | Kakuta et al. |
| 4,866,850 A | 9/1989 | Kelly et al. |
| 4,925,189 A | 5/1990 | Braeunig |
| 5,001,466 A | 3/1991 | Orlinsky et al. |

(Continued)

*Primary Examiner*—Anh V La
(74) *Attorney, Agent, or Firm*—Stetina, Brunda, Garred & Brucker

(57) ABSTRACT

A sensor for use in an interactive electronic device. The sensor is operative to generate a plurality of different output signals corresponding to respective positions of the sensor relative to a reference plane. The movement of the sensor relative to the reference plane facilitates the movement of one or more actuation balls of respective switches of the sensor, which in turn results in the generation of differing conditions or output signals corresponding to closed or open circuit conditions selectively created by the switches.

29 Claims, 24 Drawing Sheets

U.S. PATENT DOCUMENTS

| | | |
|---|---|---|
| 5,026,157 A | 6/1991 | Winckler |
| 5,059,958 A | 10/1991 | Jacobs et al. |
| 5,130,693 A | 7/1992 | Gigandet |
| 5,168,264 A | 12/1992 | Agustin |
| 5,195,746 A | 3/1993 | Boyd et al. |
| 5,209,343 A | 5/1993 | Romano |
| 5,290,198 A | 3/1994 | Nakayama |
| 5,300,921 A | 4/1994 | Hoch et al. |
| 5,402,107 A | 3/1995 | Rencavage |
| 5,434,559 A | 7/1995 | Smiley et al. |
| 5,450,049 A | 9/1995 | Bachmann |
| 5,529,070 A | 6/1996 | Augustine et al. |
| 5,610,338 A | 3/1997 | Kato et al. |
| 5,639,999 A * | 6/1997 | Hsu ..................... 200/61.52 |
| 5,646,601 A | 7/1997 | Wallace et al. |
| 5,694,340 A | 12/1997 | Kim |
| 5,703,567 A | 12/1997 | Cleveland |
| 5,798,912 A | 8/1998 | Brown et al. |
| 5,934,191 A * | 8/1999 | Tukahara et al. ......... 101/128.4 |
| 5,992,849 A | 11/1999 | Olti et al. |
| 6,106,398 A | 8/2000 | Davis |
| 6,157,898 A | 12/2000 | Marinelli |
| 6,200,219 B1 | 3/2001 | Rudell et al. |
| 6,215,978 B1 | 4/2001 | Ruzic et al. |
| 6,340,980 B1 | 1/2002 | Ho |
| 6,343,732 B1 * | 2/2002 | Graves et al. ................. 228/39 |
| 6,377,187 B1 | 4/2002 | Fong |
| 6,399,941 B1 | 6/2002 | Nakagaki et al. |
| 6,437,703 B1 | 8/2002 | Fong |
| 7,239,248 B2 * | 7/2007 | Fong ....................... 340/686.1 |

\* cited by examiner

LEVEL/POSITION SENSOR AND RELATED ELECTRONIC CIRCUITRY FOR INTERACTIVE TOY

CROSS-REFERENCE TO RELATED APPLICATIONS

The present application is a continuation-in-part of U.S. application Ser. No. 10/872,015 entitled LEVEL/POSITION SENSOR AND RELATED ELECTRONIC CIRCUITRY FOR INTERACTIVE TOY filed Jun. 18, 2004 now U.S. Pat. No. 7,239,248, which is a continuation-in-part of U.S. application Ser. No. 10/628,007 entitled LEVEL/POSITION SENSOR AND RELATED ELECTRONIC CIRCUITRY FOR INTERACTIVE TOY filed Jul. 25, 2003 now U.S. Pat. No. 6,995,680, which claims priority to U.S. Provisional Application Ser. No. 60/398,372 entitled LEVEL/POSITION SENSOR AND RELATED ELECTRONIC CIRCUITRY FOR INTERACTIVE TOY filed Jul. 25, 2002, and is a continuation-in-part of U.S. application Ser. No. 10/179,569 entitled LEVEL/POSITION SENSOR AND RELATED ELECTRONIC CIRCUITRY FOR INTERACTIVE TOY filed Jun. 25, 2002 now U.S. Pat. No. 6,909,374, which is a continuation of U.S. application Ser. No. 09/568,900 entitled LEVEL/POSITION SENSOR AND RELATED ELECTRONIC CIRCUITRY FOR INTERACTIVE TOY filed May 11, 2000 and issued as U.S. Pat. No. 6,437,703 on Aug. 20, 2002, which is a continuation-in-part of U.S. application Ser. No. 09/478,388 entitled LEVEL/POSITION SENSOR AND RELATED ELECTRONIC CIRCUITRY FOR INTERACTIVE TOY filed Jan. 6, 2000 and issued as U.S. Pat. No. 6,377,187 on Apr. 23, 2002, the disclosures of which are incorporated herein by reference.

STATEMENT RE: FEDERALLY SPONSORED RESEARCH/DEVELOPMENT

Not Applicable

BACKGROUND OF THE INVENTION

The present application relates generally to interactive electronic devices, and more particularly to a uniquely configured sensor and associated electronic circuitry which may be incorporated into interactive electronic toys and games (including dolls, toy airplanes, and remote controllers such as joysticks) and is operative to produce various visual and/or audible outputs or signal transmissions corresponding to the level/position of the toy relative to a prescribed plane.

There is currently known in the prior art a multitude of interactive electronic toys which are capable of producing a wide variety of visual and/or audible outputs. In the prior art toys, these outputs are typically triggered as a result of the user (e.g., a child) actuating one or more switches of the toy. The switch(es) of the prior art toys are most typically actuated by pressing one or more buttons on the toy, opening and/or closing a door or a hatch, turning a knob or handle, inserting an object into a complementary receptacle, etc. In certain prior art interactive electronic toys, the actuation of the switch is facilitated by a specific type of movement of the toy. However, in those prior art electronic toys including a motion actuated switch, such switch is typically capable of generating only a single output signal as a result of the movement of the toy.

The present invention provides a uniquely configured sensor and associated electronic circuitry which is particularly suited for use in interactive electronic toys and games, including dolls, toy airplanes, and remote controllers such as joysticks. The present sensor is specifically configured to generate a multiplicity of different output signals which are a function of (i.e., correspond to) the level/position of the toy relative to a prescribed plane. Thus, interactive electronic toys and games incorporating the sensor and associated electronic circuitry of the present invention are far superior to those known in the prior art since a wide variety of differing visual and/or audible outputs and/or various signal transmissions may be produced simply by varying or altering the level/position of the toy relative to a prescribed plane. For example, the incorporation of the sensor and electronic circuitry of the present invention into an interactive electronic toy such as a toy airplane allows for the production of differing visual and/or audible outputs as a result of the toy airplane being tilted in a nose-up direction, tilted in a nose-down direction, banked to the left, banked to the right, and turned upside down. As indicated above, the output signals generated by the sensor differ according to the level/position of the sensor relative to a prescribed plane, with the associated electronic circuitry of the present invention being operative to facilitate the production of various visual and/or audible outputs and/or various signal transmissions corresponding to the particular output signals generated by the sensor.

If incorporated into a joystick or other remote controller, the present sensor and associated electronic circuitry may be configured to facilitate the production of the aforementioned visual and/or audible outputs, and/or generate electrical/electronic signals, radio signals, infrared signals, microwave signals, or combinations thereof which may be transmitted to another device to facilitate the control and operation thereof in a desired manner. The frequency and/or coding of the radio, microwave, or electrical/electronic signals and the coding of the infrared signals transmitted from the joystick or other remote controller would be variable depending upon the level or position of the same relative to a prescribed plane. Moreover, the present electronic circuitry may be specifically programmed to memorize or recognize a prescribed sequence of movements of the sensor relative to a prescribed plane. More particularly, a prescribed sequence of states or output signals generated by the sensor corresponding to a prescribed sequence of movements thereof, when transmitted to the electronic circuitry, may be used to access a memory location in the electronic circuitry in a manner triggering or implementing one or more pre-programmed visual and/or audible functions or effects and/or the transmission of various electrical (hard wired), infrared, radio, or microwave signals to another device for communication and/or activation of various functions thereof. These, and other unique attributes of the present invention, will be discussed in more detail below.

BRIEF SUMMARY OF THE INVENTION

In accordance with the present invention, there is provided a sensor for use in an interactive electronic device. The sensor is operative to generate a plurality of different output signals corresponding to respective positions of the sensor relative to a reference plane. The movement of the sensor relative to the reference plane facilitates the movement of one or more actuation balls of respective switches of the sensor, which in turn results in the generation of differing conditions or output signals corresponding to the particular pattern of electrical or conductive connection within the sensor facilitated by the switches thereof.

BRIEF DESCRIPTION OF THE DRAWINGS

These, as well as other features of the present invention, will become more apparent upon reference to the drawings wherein.

DETAILED DESCRIPTION OF THE INVENTION

Figure 1:
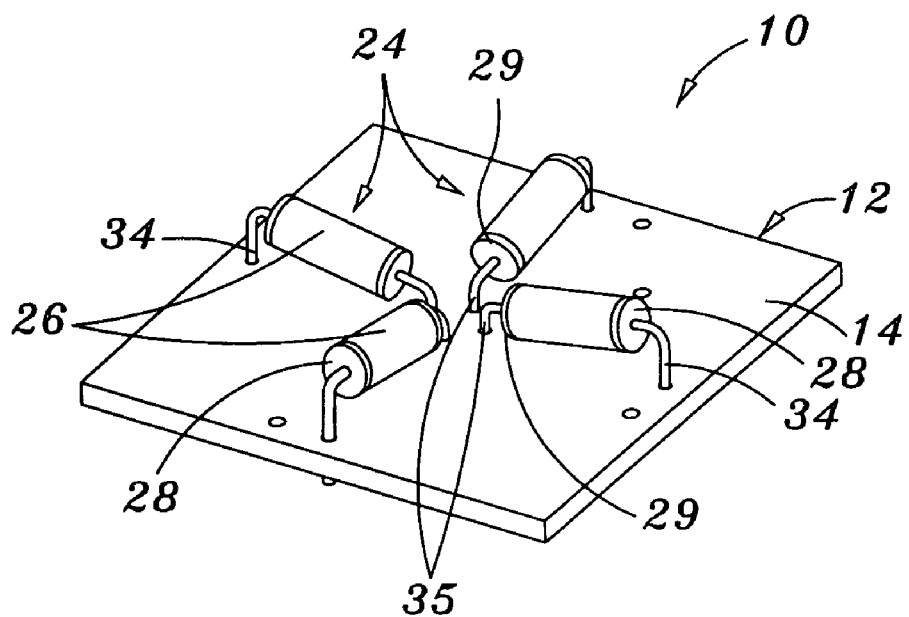
FIG. 1 is a top perspective view of a sensor constructed in accordance with a first embodiment of the present invention.
Figure 2:
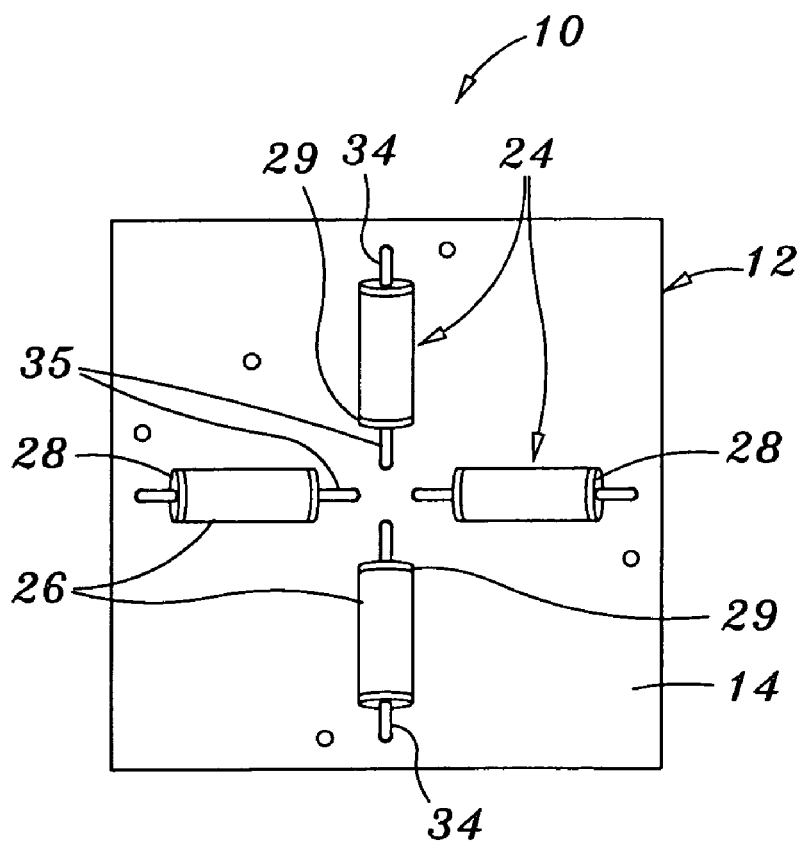
FIG. 2 is a top plan view of the sensor of the first embodiment.

Referring now to the drawings wherein the showings are for purposes of illustrating preferred embodiments of the present invention only, and not for purposes of limiting the same, FIG. 1-4 perspectively illustrate a sensor 10 constructed in accordance with a first embodiment of the present invention. The sensor 10 comprises a base plate 12 which, as seen in FIGS. 1-4, has a generally quadrangular (e.g., square) configuration. The base plate 12 defines a generally planar top surface 14 and an opposed, generally planar bottom surface 16. Formed on the bottom surface 16 of the base plate 12 is a conductive pattern 18 which may comprise one or more conductive pads and/or one or more conductive traces which is/are arranged in any one of a multiplicity of differently arranged patterns, the present invention not being limited to any prescribed pattern for the conductive pattern 18. The conductive pattern 18 is preferably fabricated from a conductive metallic material, such as copper. The formation of the conductive pattern 18 may be facilitated through the completion of a conventional etching process subsequent to the application of a metal layer to bottom surface 16 of the base plate 12. The base plate 12 is itself preferably fabricated from a non-conductive, insulative material. Disposed with the base plate 12 are a plurality of apertures 20 which extend through the base plate 12 and prescribed portions of the conductive pattern 18 on the bottom surface 16 thereof.

Figure 5:
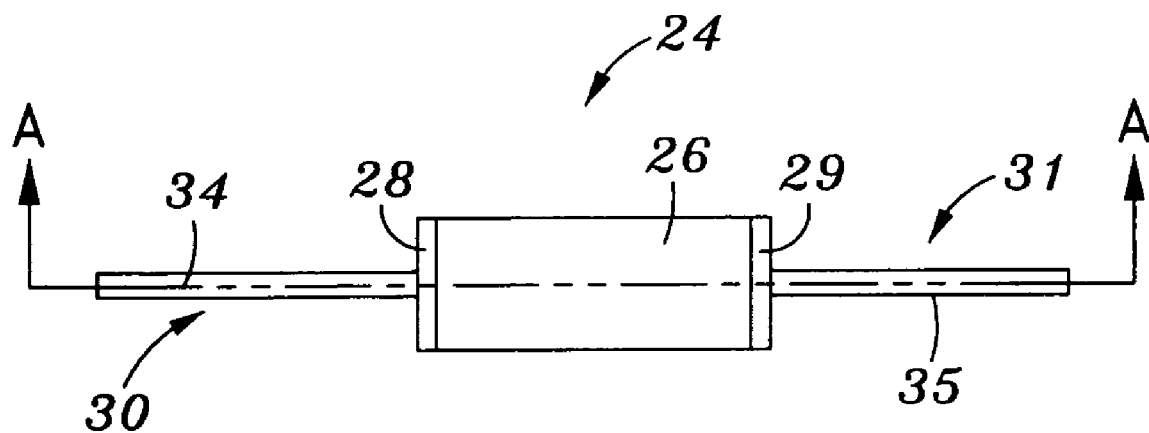
FIG. 5 is a side elevational view of a switch of the sensor of the first embodiment.
Figure 6:
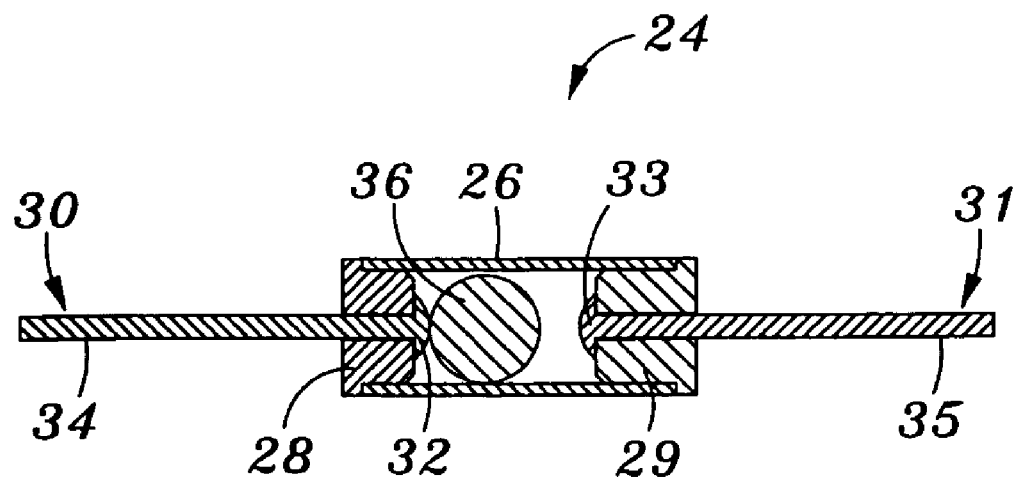
FIG. 6 is a cross-sectional view of the switch taken along line A-A of FIG. 5.
Figure 7:
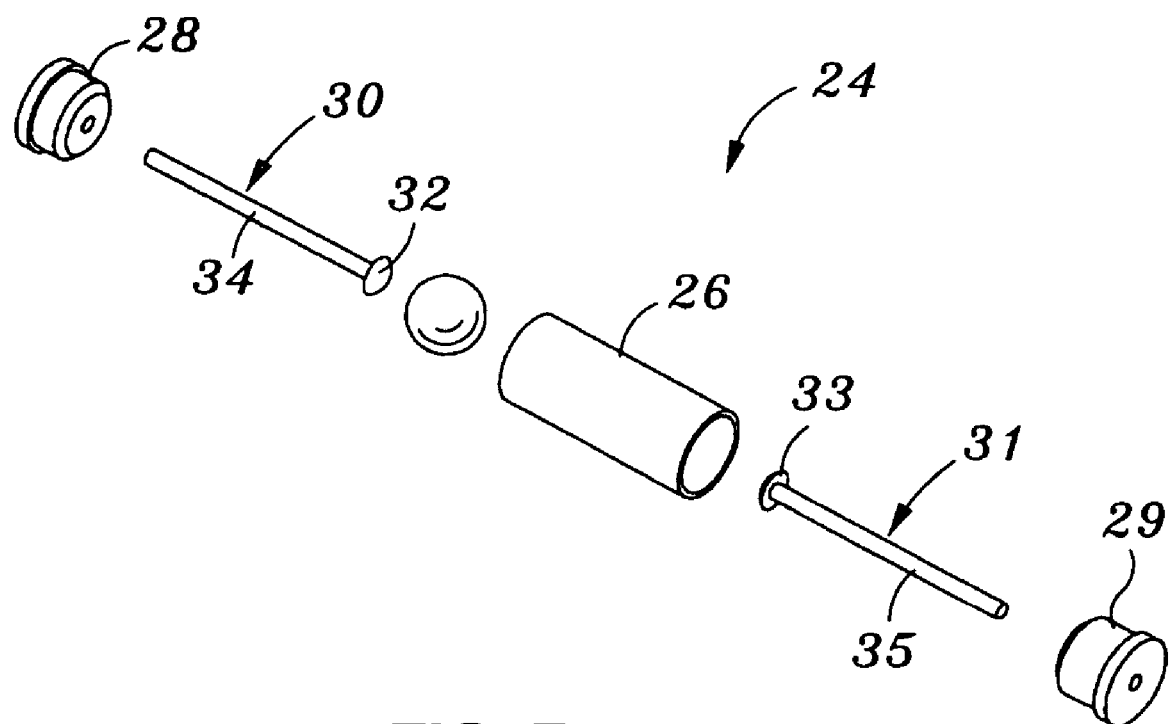
FIG. 7 is an exploded view of the switch.
Figure 8:
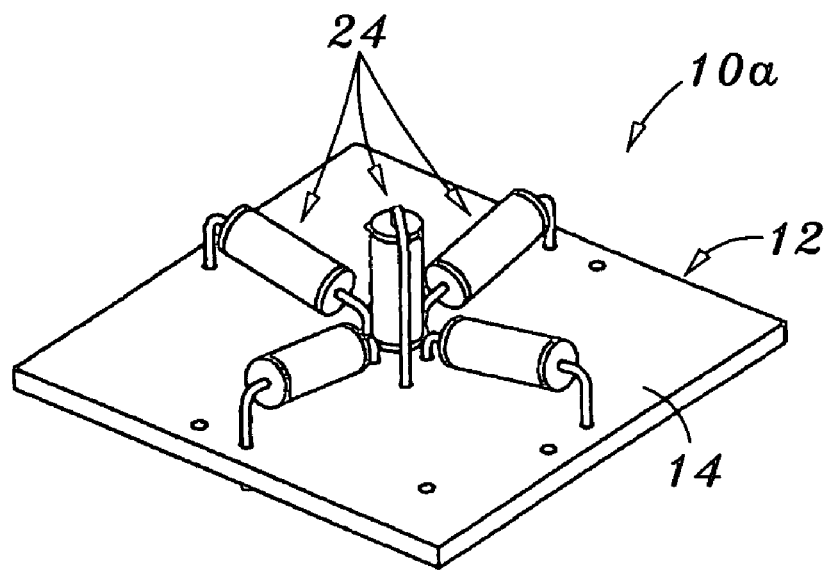
FIG. 8 is a top perspective view of a sensor constructed in accordance with a second embodiment of the present invention.

The sensor 10 of the first embodiment further comprises a plurality (e.g., four) tubular switches 24, one of which is shown in FIGS. 5-7. Each switch 24 comprises a tubular, generally cylindrical body 26 having opposed open ends. The body 26 is preferably fabricated from a conductive metal material for reasons which will be discussed in more detail below. In addition to the body 26, each switch 24 comprises a closure member or plug 28 which is advanced into and effectively seals or encloses one open end of the body 26 as best seen in FIG. 6. The plug 28 is preferably fabricated from a non-conductive, insulative material. Advanced through the plug 28 is a first contact pin 30 of the switch 24. The first contact pin 30 has an enlarged, button-like inner end 32 and an elongate pin portion 34 which extends axially from the inner end 32. As further seen in FIG. 6, the pin portion 34 of the first contact pin 30 is advanced through the plug 28 such that the inner end 32 is abutted against the inner surface of the plug 28 and thus resides within the enclosed interior of the body 26. Like the body 26, the first contact pin 30 is also fabricated from a conductive metal material.

Each switch 24 further comprises a stopper 29 which is advanced into and effectively seals or encloses the opposite, remaining open end of the body 26. The stopper 29 is preferably fabricated from a conductive, metal material. Advanced through the stopper 29 is a second contact pin 31 of the switch 24. Like the first contact pin 30, the second contact pin 31 has an enlarged, button-like inner end 33 and an elongate pin portion 35 which extends axially from the inner end 33. The pin portion 35 of the second contact pin 31 is advanced through the stopper 29 such that the inner end 33 is abutted against the inner surface of the stopper 29 and thus resides within the enclosed interior of the body 26. The second contact pin 31 is also fabricated from a conductive metal material.

Each switch 24 further comprises at least one spherical actuation ball 36 which, as seen in FIG. 6, is captured in the enclosed hollow interior of the body 26. As will be recognized, the actuation ball 36 is disposed within the interior of the body 26 prior to the advancement of the plug 28 into the one open end thereof or the advancement of the stopper 29 into the other open end thereof. The actuation ball 36 is itself fabricated from a conductive metal material.

Figure 3:
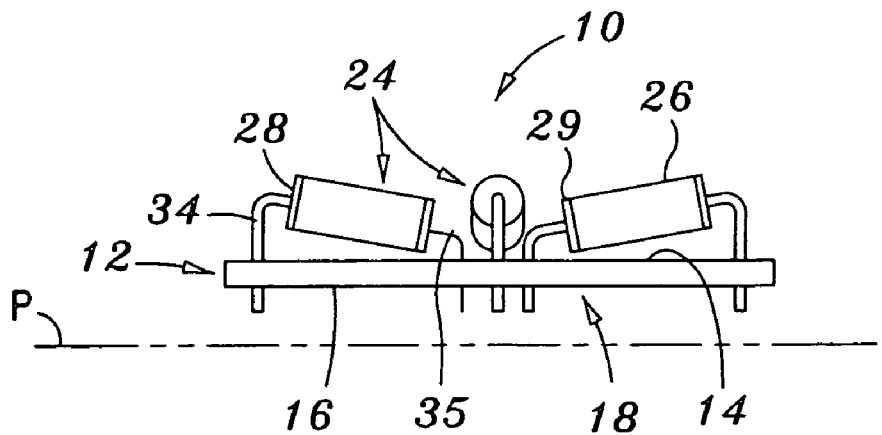
FIG. 3 is a side elevational view of the sensor of the first embodiment.
Figure 4:
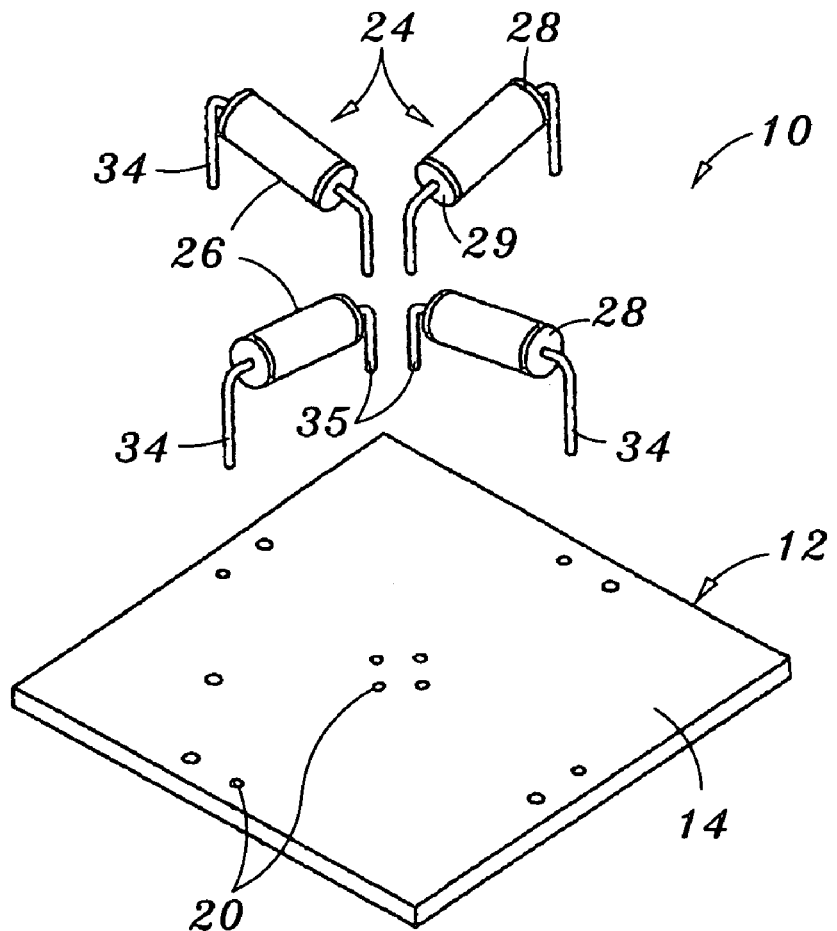
FIG. 4 is an exploded view of the sensor of the first embodiment.

Referring again to FIGS. 1-4, the sensor 10 is assembled by orienting the switches 24 such that the stoppers 29 are disposed closer to the top surface 14 of the base plate 12 than the plugs 28, i.e., the open end of the body 26 which is enclosed by the plug 28 is disposed at a higher elevation relative to the top surface 14 of the base plate 12 as compared to the open end of the body 26 enclosed by the stopper 29 as shown in FIG. 3. To achieve this positioning, the pin portions 34, 35 of the first and second contact pins 30, 31 of each switch 24 are bent and advanced through respective, corresponding apertures 20 of the base plate 12. In this regard, as also seen in FIG. 3, it is contemplated that the pin portion 34 of each first contact pin 30 will be bent to define an angle of less than about ninety degrees, with the pin portion 35 of each second contact pin 31 being bent to define an angle of more than about ninety degrees. Importantly, the pin portions 34, 35 of the first and second contact pins 30, 31, upon being advanced through respective ones of the apertures 20, are placed into electrical communication with the conductive pattern 18 on the bottom surface 16 of the base plate 12. The pin portions 34, 35 are also secured to the conductive pattern 18 through the use of solder or a similar conductive metal in a manner maintaining the switches 24 in the elevated orientations relative to the top surface 14 described above. Thus, the body 26 of each switch 24 extends slightly angularly upwardly from the top surface 14 outwardly toward a respective peripheral edge segment of the base plate 12. It is contemplated that such angular elevation of each switch 24 may be any elevation greater than zero degrees, and may be specifically set or established to accomplish a prescribed function or result.

Due to the manner in which the switches 24 are interfaced to the base plate 12 as described above, the bodies 26 of the switches 24 are each placed into electrical communication with the conductive pattern 18 via respective ones of the stoppers 29 and second contact pins 31. The first contact pins 30 are also each placed into electrical communication with the conductive pattern 18 in the above-described manner. Within each switch 24, the actuation ball 36 is in conductive contact with the body 26 and selectively placeable into conductive contact with either the inner end 32 of the first contact pin 30 or the inner end 33 of the second contact pin 31.

In the sensor 10, each switch 24 is selectively placeable into either an open circuit or a closed circuit condition, i.e., an on or off state. When the sensor 10 is oriented such that the base plate 12 extends in spaced, generally parallel relation to a reference plane P as shown in FIG. 3, the actuation ball 36 of each switch 24 will roll or move into contact with the inner end 33 of the second contact pin 31. The movement of each actuation ball 36 into contact with a respective inner end 33 occurs as a result of the angular inclination of each body 26 as described above. In this neutral position wherein the actuation balls 36 are all disposed against the inner ends 33 of the second contact pins 31, an open circuit condition is created as a result of the gap between each actuation ball 36 and the inner end 32 of the corresponding first contact pin 30 which is electrically isolated from the body 26 due to the advancement of the pin portion 34 thereof through an insulator (i.e., the corresponding plug 28).

As will be recognized, the movement of the sensor 10 so as to cause the base plate 12 to be shifted out of parallel relation to the reference plane P will cause the actuation ball 36 of at least one of the switches 24 to roll away from the inner end 33 of the corresponding second contact pin 31 and into contact with the inner end 32 of the corresponding first contact pin 30. When such contact occurs, a closed circuit condition is created, such circuit being defined by the electrical connection of the pin portions 34, 35 of the first and second contact pins 30, 31 to the conductive pattern 18, the conductive contact between the second contact pin 31 and the stopper 29, the conductive contact between the stopper 29 and the body 26, the conductive contact between the body 26 and the actuation ball 36, and the conductive contact between the actuation ball 36 and the inner end 32 of the first contact pin 30. The movement of the actuation ball 36 toward the inner end 32 is typically facilitated even upon only a very slight shift of the base plate 12 out of parallel relation to the reference plane P. The angular orientation of each body 26 relative to the top surface 14 of the base plate 12 is desirable to assure that an open circuit condition is achieved when the sensor 10 is in a neutral position, i.e., the base plate 12 is disposed in generally parallel relation to the reference plane P.

Figure 42:
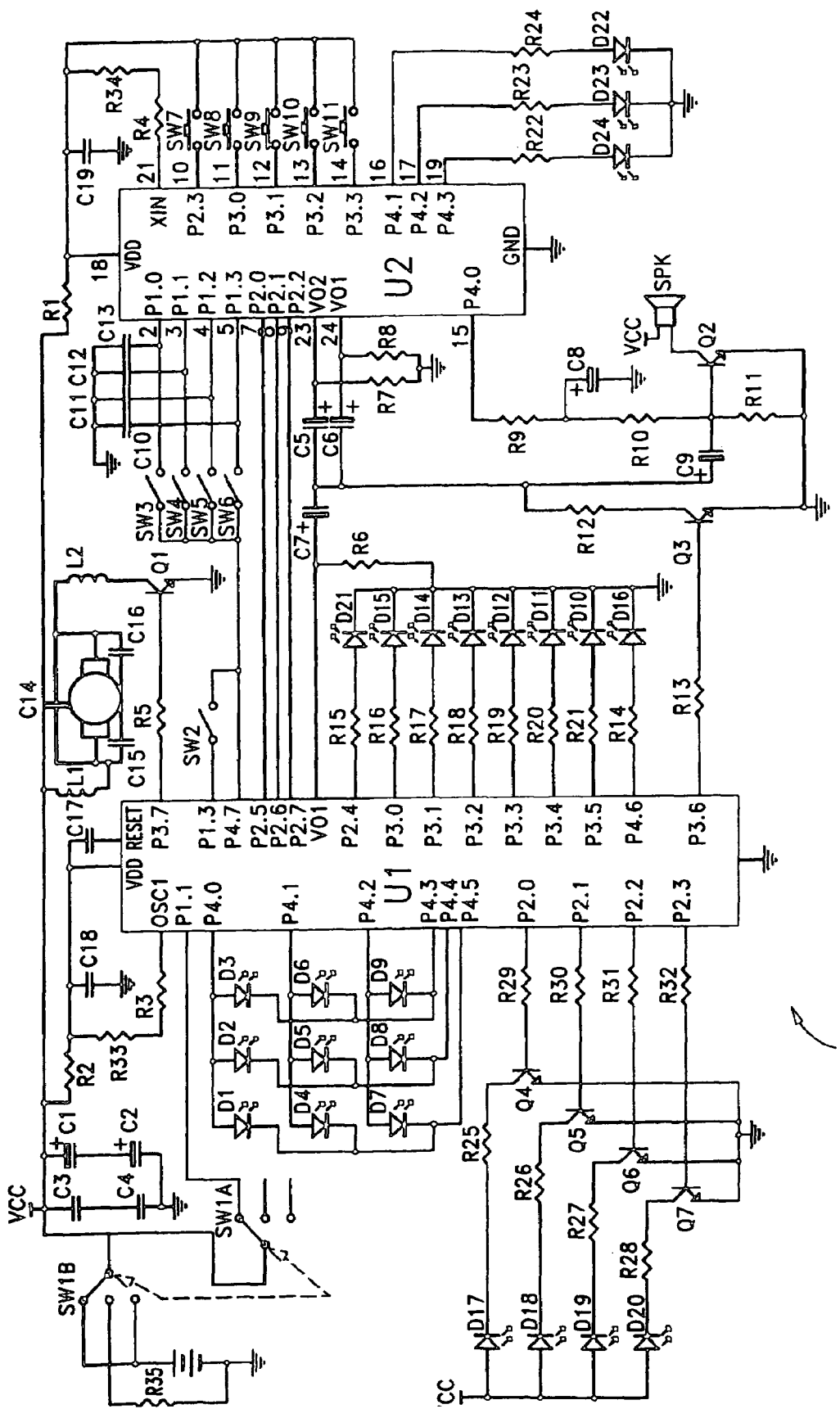
FIGS. 42 and 43 are schematic diagrams of exemplary electronic circuitry which may be used in conjunction with the sensors of the first through tenth embodiments.
Figure 43:
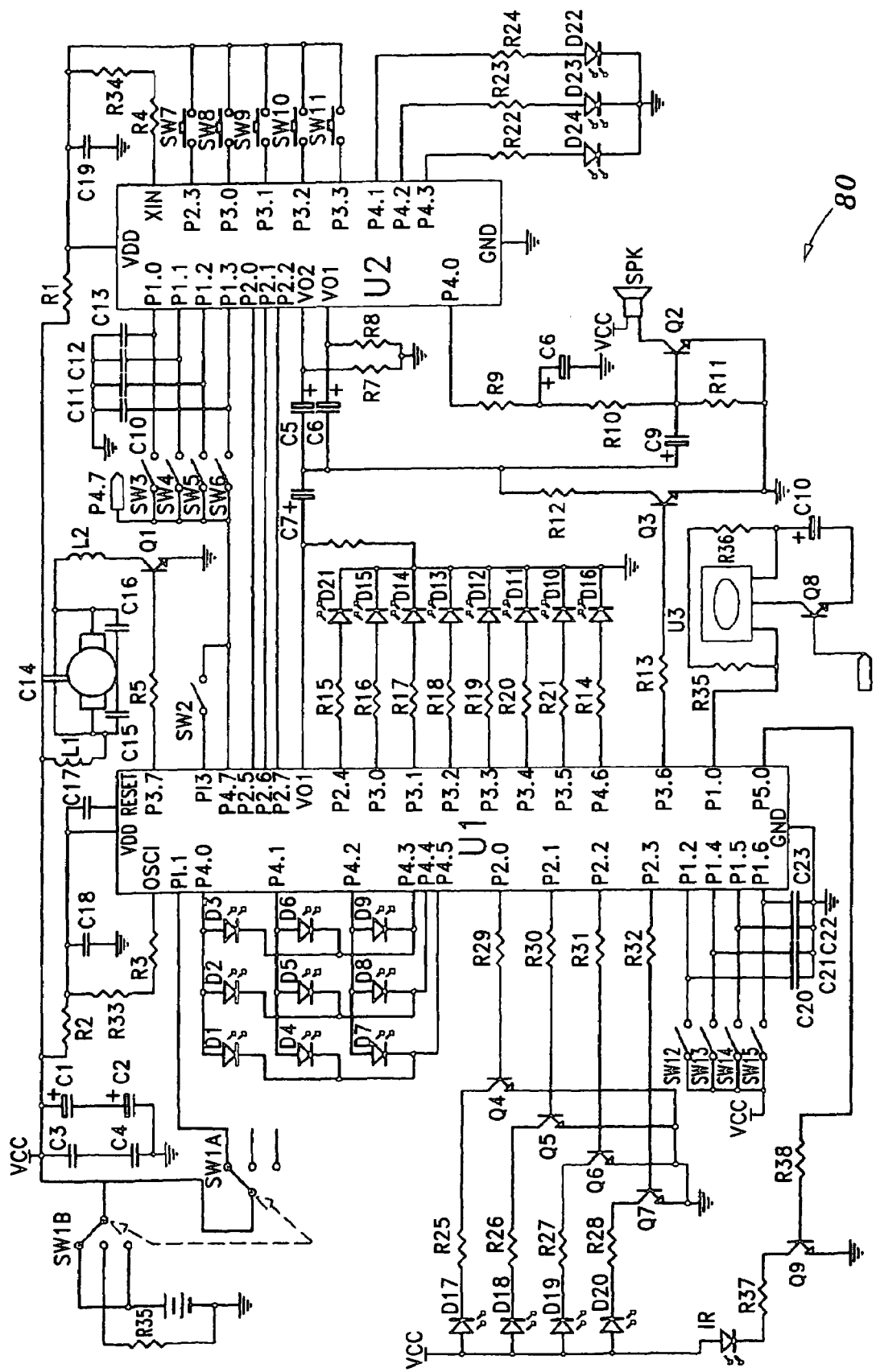

As will be recognized, depending on the manner in which the base plate 12 is tilted or shifted out of parallel relation to the reference plane P, the actuation balls 36 of two or more of the switches 24 may be brought into conductive contact with corresponding ones of the first contact pins 30 at the same time. Thus, as will be recognized, the sensor 10 has the capability of generating a multiplicity of different conditions or states depending on the angular displacement of the base plate 12 relative to the reference plane P. As indicated above, when the base plate 12 is in its neutral position and thus disposed in substantially parallel relation to the reference plane P, no output signal is generated by the sensor 10 due to the existence of the open circuit conditions attributable to the separation between the actuation balls 36 and the first contact pins 30. However, the shifting of the position of the base plate 12 relative to the reference plane P will cause one or more different output signals to be generated by the sensor 10, depending on which actuation ball(s) 36 are brought into conductive contact with the corresponding first contact pin(s) 30. In this regard, the sensor 10 is preferably used in conjunction with electronic circuitry which has the functional capability of producing certain visual and/or audible effects, depending on which output signal(s) are transmitted thereto from the sensor 10. It is contemplated that such electronic circuitry will be programmable, and may be programmed to produce a selected effect upon a prescribed sequence of output signals being transmitted thereto from the sensor 10. As indicated above, the sensor 10 and the complimentary electronic circuitry may be integrated into any one of a multiplicity of different interactive devices, one such exemplary device being an interactive toy. Exemplary configurations of the electronic circuitry which may be used in conjunction with the sensor 10 include the electronic circuitry 78, 80 shown in FIG. 42 and 43, respectively, and the electronic circuitry described in detail in the above-recited parent applications, the pertinent disclosures of which are expressly incorporated herein by reference.

Though not shown, it is contemplated that each switch 24 may alternatively be configured to include more than one actuation ball 36. The inclusion of more than one actuation ball 36 within the body 26 of each switch 24 provides more weight, which in turn assists in the movement of the actuation balls 36 toward a corresponding first contact pin 30 upon the movement of the base plate 12 out of parallel relation to the reference plane P. Further, though the sensor 10 as described above is configured such that the switches 24 are in a normally open position when the base plate 12 is in its neutral position and thus disposed in substantially parallel relation to the reference plane P, those of ordinary skill in the art will recognize that the sensor 10 may also be configured such that the switches 24 are normally closed when the base plate 12 is in its neutral position, i.e., the angular inclinations of the switches 24 being reversed in comparison to those described above in relation to the switches 24 being normally open. As will be appreciated by those of ordinary skill in the art, the program of the MCU of the electronic circuitry that is used in conjunction with such alternately configured sensor 10 will be modified as needed to properly interact therewith and produce the desired visual and/or audible effects upon the movement of the base plate 12 out of parallel relation to the reference plane P.

Though also not shown, it is further contemplated the switches 24 may all be positioned on the bottom surface 16 of the base plate 12, or positioned on both the top and bottom surfaces 14, 16 rather than solely on the top surface 14. However, any switch(es) 24 positioned on the bottom surface 16 of the base plate 12 must be oriented such that the plugs 28 are disposed closer to the bottom surface 16 of the base plate 12 than the stoppers 29, i.e., the open end of the body 26 which is enclosed by the stopper 29 is disposed at a higher elevation relative to the bottom surface 16 of the base plate 12 as compared to the open end of the body 26 enclosed by the plug 28. To achieve this positioning, the pin portions 34, 35 of the first and second contact pins 30, 31 of each switch 24 would be bent and advanced through respective, corresponding apertures 20 of the base plate 12. In this regard, it is contemplated that the pin portion 35 of each second contact pin 31 would be bent to define an angle of less than about ninety degrees, with the pin portion 34 of each first contact pin 30 being bent to define an angle of more than about ninety degrees. Importantly, the pin portions 34, 35 of the first and second contact pins 30, 31, upon being advanced through respective ones of the apertures 20, would be placed into electrical communication with the conductive pattern 18 which is also on the bottom surface 16 of the base plate 12. The pin portions 34, 35 would also be secured to the conductive pattern 18 through the use of solder or a similar conductive metal in a manner maintaining any switch(es) 24 positioned on the bottom surface 16 in the elevated orientations described above. Thus, the body 26 of any switch 24 positioned on the bottom surface 16 extends slightly angularly downwardly therefrom and outwardly toward a respective peripheral edge segment of the base plate 12. It is contemplated that such angular elevation of any switch 24 positioned on the bottom surface 16 may be any elevation greater than zero degrees, and may be specifically set or established to accomplish a prescribed function or result. It will be recognized that the reverse orientation of any switch(es) 24 on the bottom surface 16 in comparison to those on the top surface 14 is necessary to cause such switch(es) 24 on the bottom surface 16 to achieve the aforementioned open circuit condition when the base plate 12 assumes the orientation relative to the reference plane P shown in FIG. 3.

Referring now to FIGS. 8-11, there is shown a sensor 10a constructed in accordance with a second embodiment of the present invention. The sensor 10a of the second embodiment is similar in structure and function to the sensor 10 of the first embodiment described above. Thus, only the distinctions or variations between the sensors 10, 10a will be discussed below.

Figure 9:
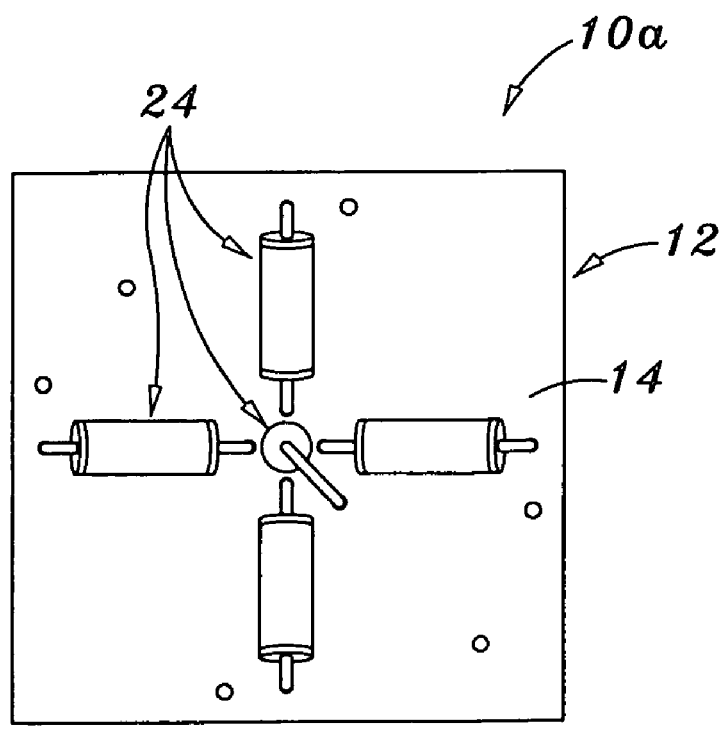
FIG. 9 is a top plan view of the sensor of the second embodiment.
Figure 10:
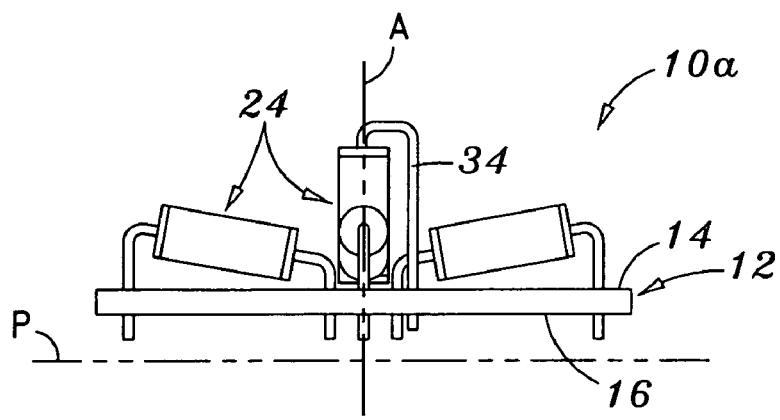
FIG. 10 is a side elevational view of the sensor of the second embodiment.
Figure 11:
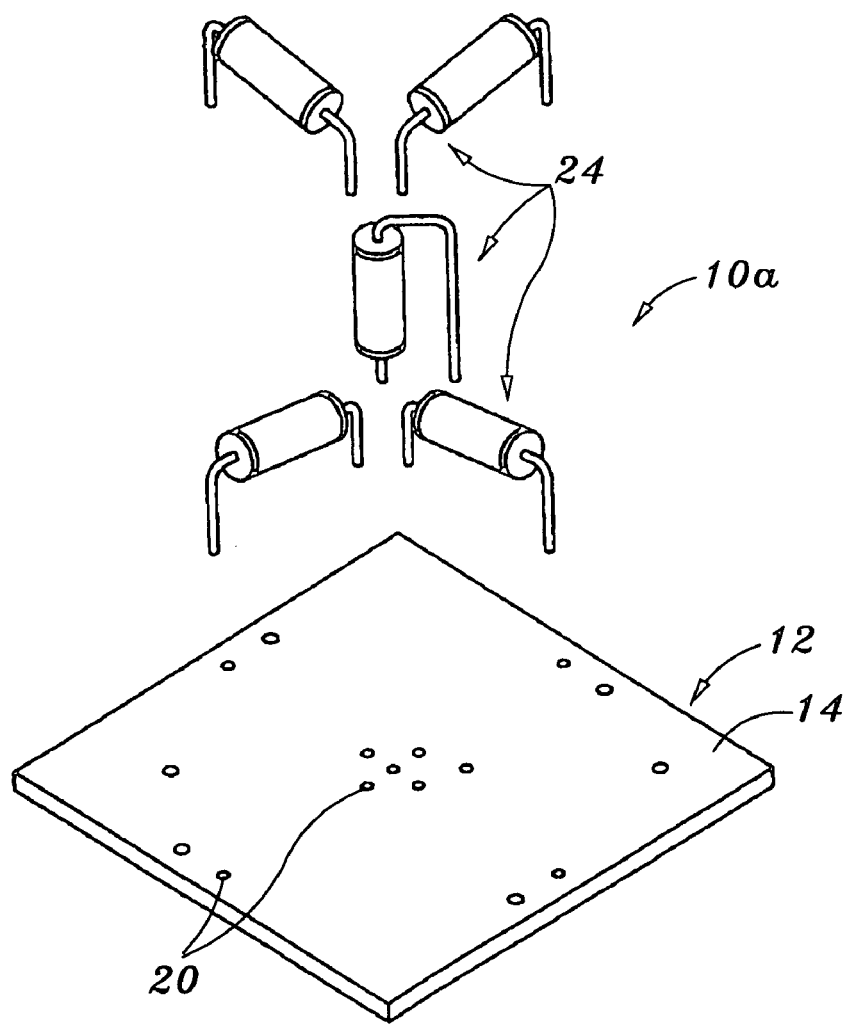
FIG. 11 is an exploded view of the sensor of the second embodiment.
Figure 12:
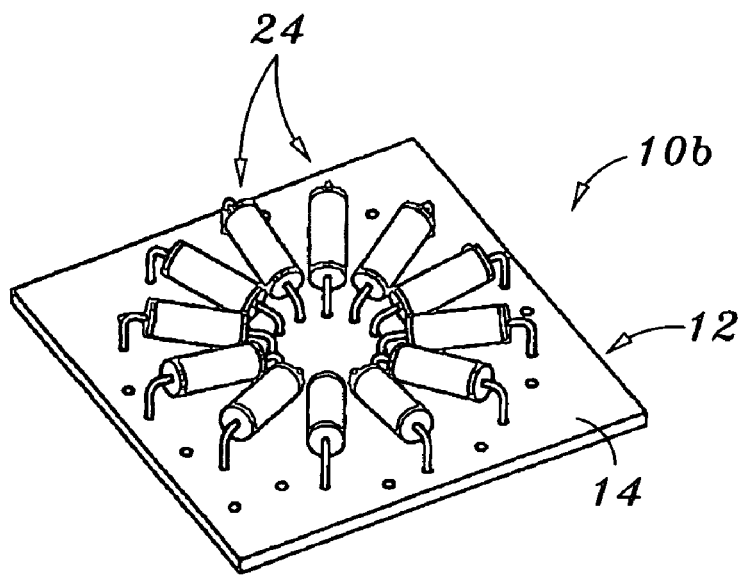
FIG. 12 is a top perspective view of a sensor constructed in accordance with a third embodiment of the present invention.
Figure 13:
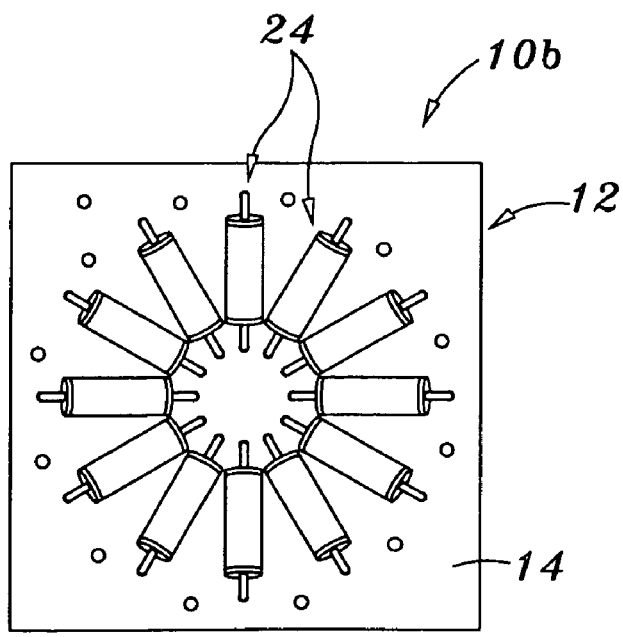
FIG. 13 is a top plan view of the sensor of the third embodiment.
Figure 14:
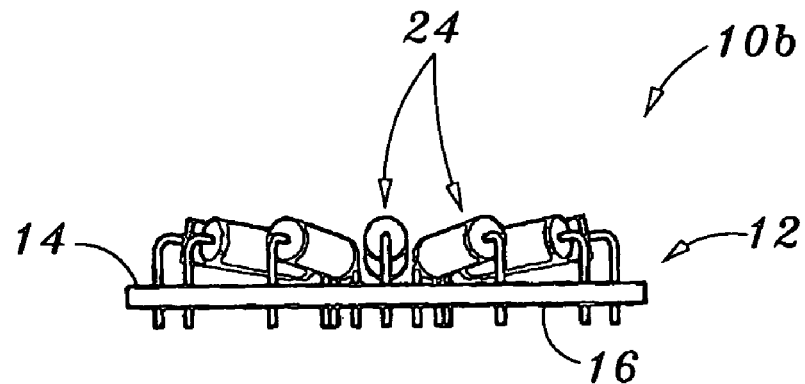
FIG. 14 is a side elevational view of the sensor of the third embodiment.
Figure 15:
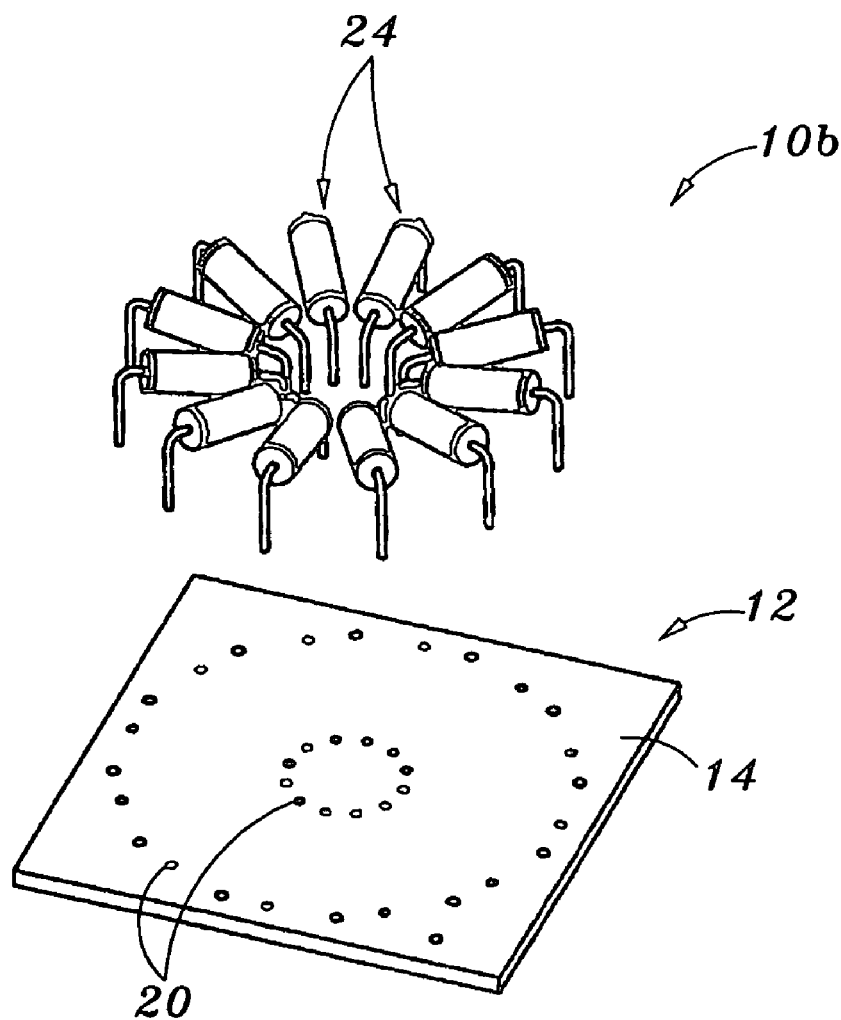
FIG. 15 is an exploded view of the sensor of the third embodiment.

The primary distinction between the sensor 10a of the second embodiment and the sensor 10 of the first embodiment is the inclusion of five switches 24 in the sensor 10a, in comparison to the four switches 24 included in the sensor 10. As best seen in FIGS. 9 and 10, the extra fifth switch 24 in the sensor 10a is oriented so as to extend along a switch axis A which itself extends generally perpendicularly relative to the top surface 14 of the base plate 12. To accommodate the fifth switch 24, the remaining four switches 24 in the sensor 10a are spaced slightly further from each other in comparison to the switches 24 of the sensor 10, thus defining a central gap or opening of sufficient size to accommodate the switch 24 extending along the axis A. In the sensor 10a, the pin portion 35 of the second contact pin 31 of the switch 24 extending along the axis A is advanced through an aperture 20 disposed in the approximate center of the base plate 12 such that the stopper 29 is disposed closer to the top surface 14 than the plug 28. The pin portion 34 of the first contact pin 30 of the fifth switch 24 oriented along the axis A is itself bent in a manner which allows it to be advanced through an aperture 20 which is disposed outward of that aperture 20 through which the pin portion 35 of the second contact pin 31 is extended. The pin portions 34, 35, subsequent to being advanced through corresponding ones of the apertures 20, are each electrically connected to the conductive pattern 18 disposed on the bottom surface 16 of the base plate 12.

The functionality of the sensor 10a of the second embodiment is similar to that described above in relation to the sensor 10 of the first embodiment. However, the sensor 10a, due its inclusion of the fifth switch 24 extending along the axis A, has the additional capability of distinguishing whether the sensor 10a is right side up or upside down relative to the reference plane P shown in FIG. 10. As depicted in FIG. 10, the sensor 10a is right side up relative to the reference plane P. In this orientation, the actuation ball 36 of the switch 24 extending along the axis A is not in conductive contact with the inner end 32 of the corresponding first contact pin 30, the actuation ball 36 actually being separated from the inner end 32 and resting directly against the inner end 33 of the second contact pin 31. If the sensor 10a were to be inverted so as to be oriented upside down relative to the reference plane P, the actuation ball 36 of the switch 24 extending along the axis A would be caused to fall or roll downwardly into conductive contact with the inner end 32 of the corresponding first contact pin 30, thus creating a closed circuit condition. As will be recognized, the electronic circuitry used in conjunction with the sensor 10a is adapted to accept and to process the additional output signal generated by the fifth switch 24 extending along the axis A. Also, though not shown, the sensor 10a of the second embodiment may be alternatively configured such that the switches 24 are positioned on only the bottom surface 16 of the base plate 12, or on both the top and bottom 14, 16, as discussed above in relation to the sensor 10. Further, depending on the design of the program in the MCU of the electronic circuitry used in conjunction with the sensor 10a, the inclusion of the fifth switch 24 can be omitted. In this regard, sensor 10 (which is the same as sensor 10a if the fifth switch 24 is omitted) can be programmed to function the same way as sensor 10*a* to detect if the sensor 10 is right side up or up side down.

Referring now to FIGS. 12-15, there is shown a sensor 10*b* constructed in accordance with a third embodiment of the present invention. The sensor 10*b* of the third embodiment is similar in structure to the sensor 10 of the first embodiment described above, with the distinction being that the sensor 10*b* includes twelve switches 24, in comparison to the four switches 24 included in the sensor 10. In the sensor 10*b*, the switches 24 are oriented upon the top surface 14 in equidistantly spaced intervals of approximately thirty degrees. The switches 24 of the sensor 10*b* are each electrically connected to the conductive pattern 18 on the bottom surface 16 of the base plate 12 in the same manner described above in relation to the switches 24 of the sensor 10.

As will be recognized, the electronic circuitry with which the sensor 10*b* is used will be adapted to accommodate the additional output signals that will be generated by the sensor 10*b* as a result of the increased number of switches 24 therein. Though not shown, those of ordinary skill in the art will recognize that a contemplated variant of the sensor 10*b* is one which further includes a thirteenth switch 24 which extends generally perpendicularly relative to the top surface 14 of the base plate 12. Though also not shown, the sensor 10*b* of the third embodiment may be alternatively configured such that the switches 24 are positioned on only the bottom surface 16 of the base plate 12, or on both the top and bottom 14, 16, as discussed above in relation to the sensor 10. Additionally, though in the sensor 10 four switches are included, and in the sensor 10*b* twelve switches are included, those of ordinary skill in the art will further recognize that sensors including fewer than four switches 24, greater than twelve switches 24, or some number of switches 24 between four and twelve are considered to be within the spirit and scope of the present invention.

Figure 16:
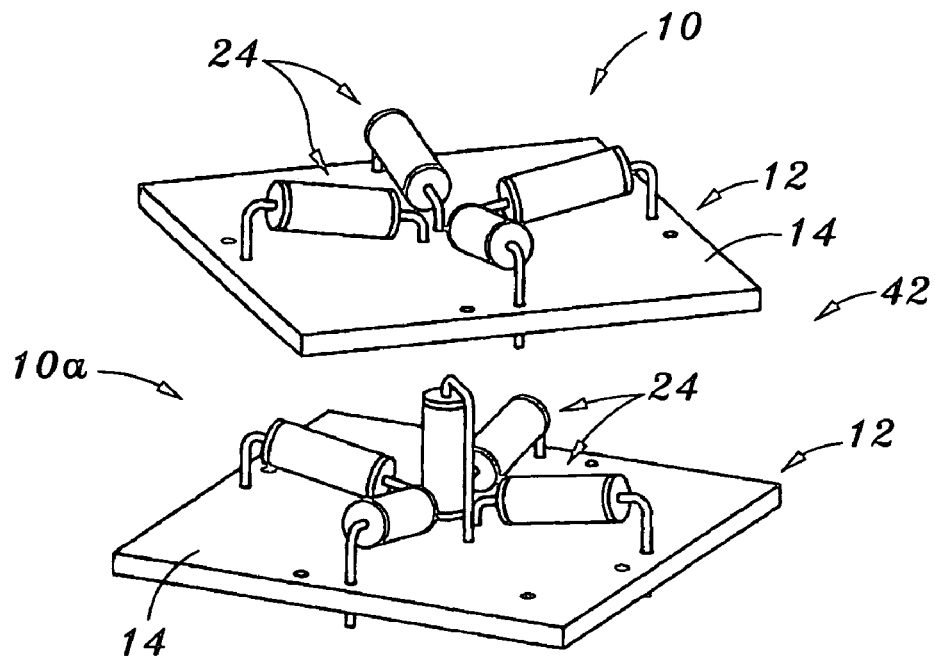
FIG. 16 is a perspective view of a sensor constructed in accordance with a fourth embodiment of the present invention.
Figure 17:
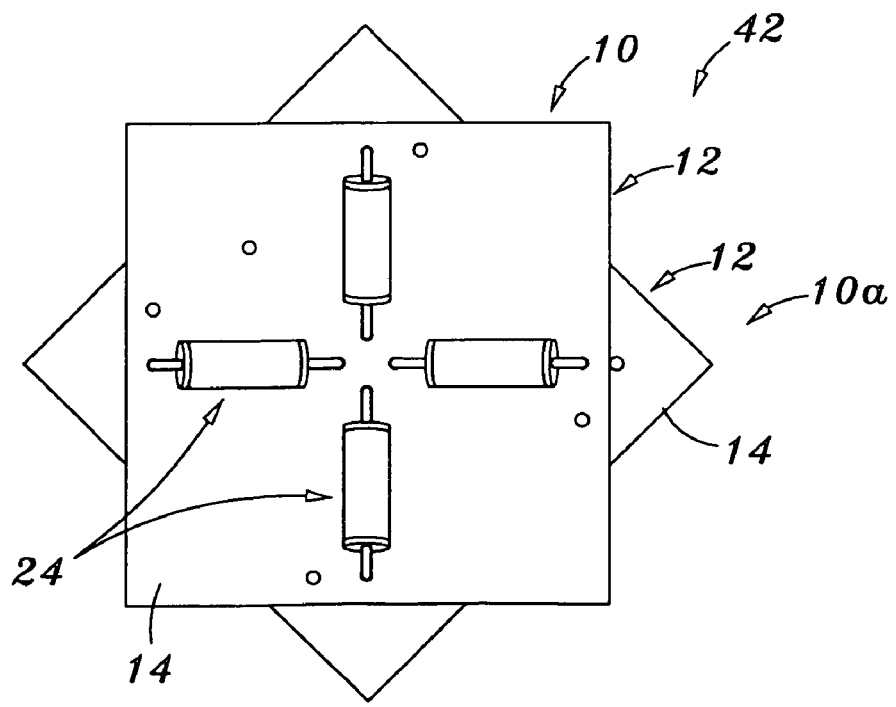
FIG. 17 is a top plan view of the sensor of the fourth embodiment.
Figure 18:
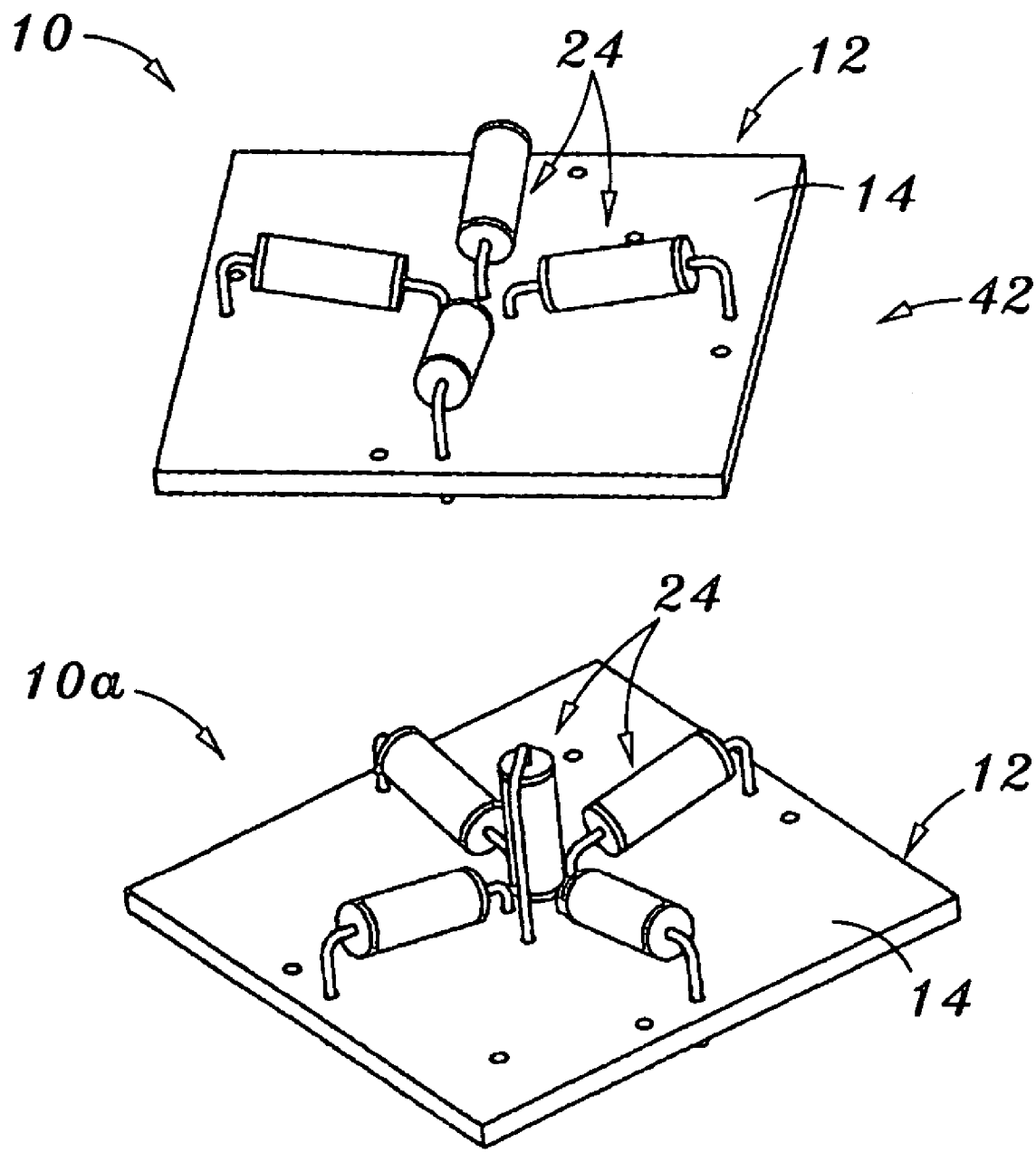
FIG. 18 is a perspective view of the sensor of the fourth embodiment.

Referring now to FIGS. 16-18, there is shown a sensor 42 constructed in accordance with a fourth embodiment of the present invention. The sensor 42 is essentially an assembly comprising a combination of the sensor 10 of the first embodiment and the sensor 10*a* of the second embodiment. In the sensor 42, the sensors 10, 10*a* are oriented relative to each other such that the switches 24 of the sensors 10, 10*a* (other than for the fifth, central switch 24 of the sensor 10*a*) will be oriented at intervals of approximately forty five degrees relative to each other. To facilitate such orientations, it is contemplated that sensors 10, 10*a* in the sensor 42 will be mounted to either a common support or independent supports such that the base plate 12 of the sensor 10 is offset approximately forty five degrees relative to the base plate 12 of the sensor 10*a*. As will be recognized, the sensor 42 including the combined sensors 10, 10*a* includes substantially increased functionality in comparison to either sensor 10 or sensor 10*a* standing alone.

Figure 19:
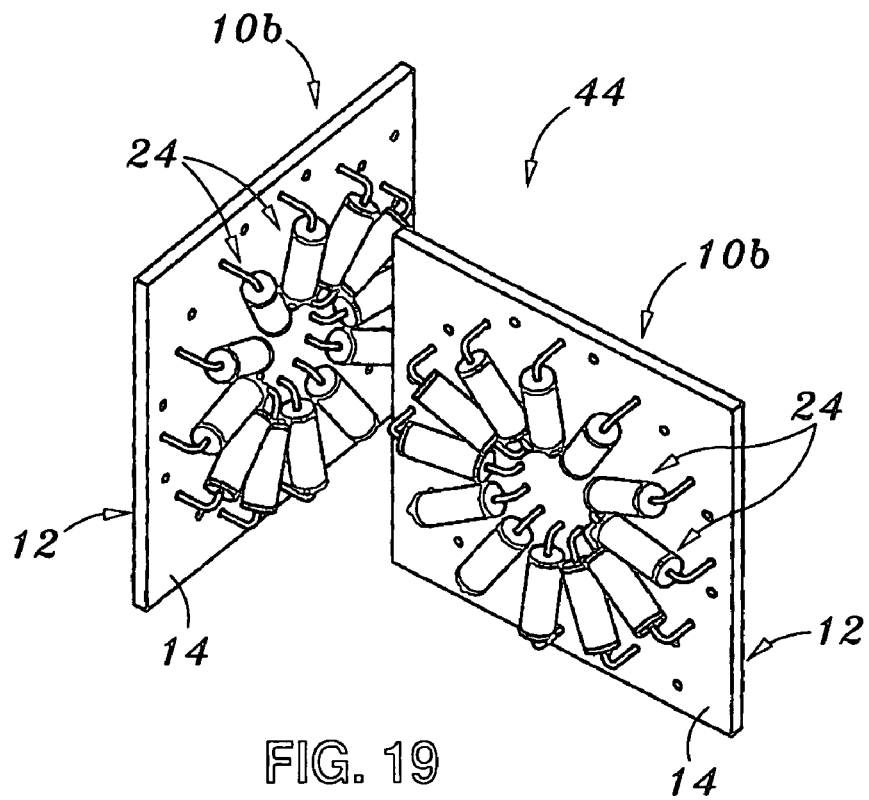
FIG. 19 is a perspective view of a sensor constructed in accordance with a fifth embodiment of the present invention.
Figure 20:
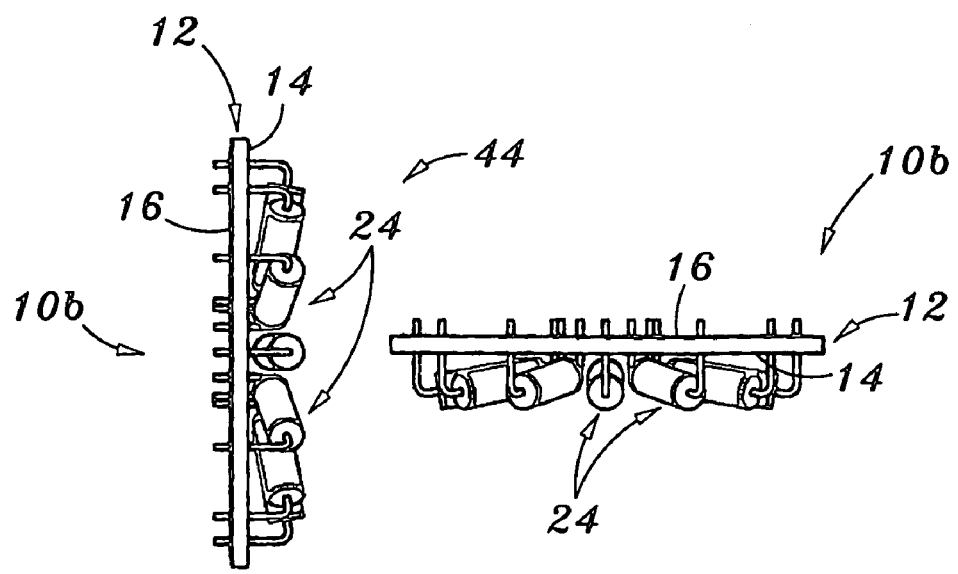
FIG. 20 is a top plan view of the sensor of the fifth embodiment.
Figure 21:
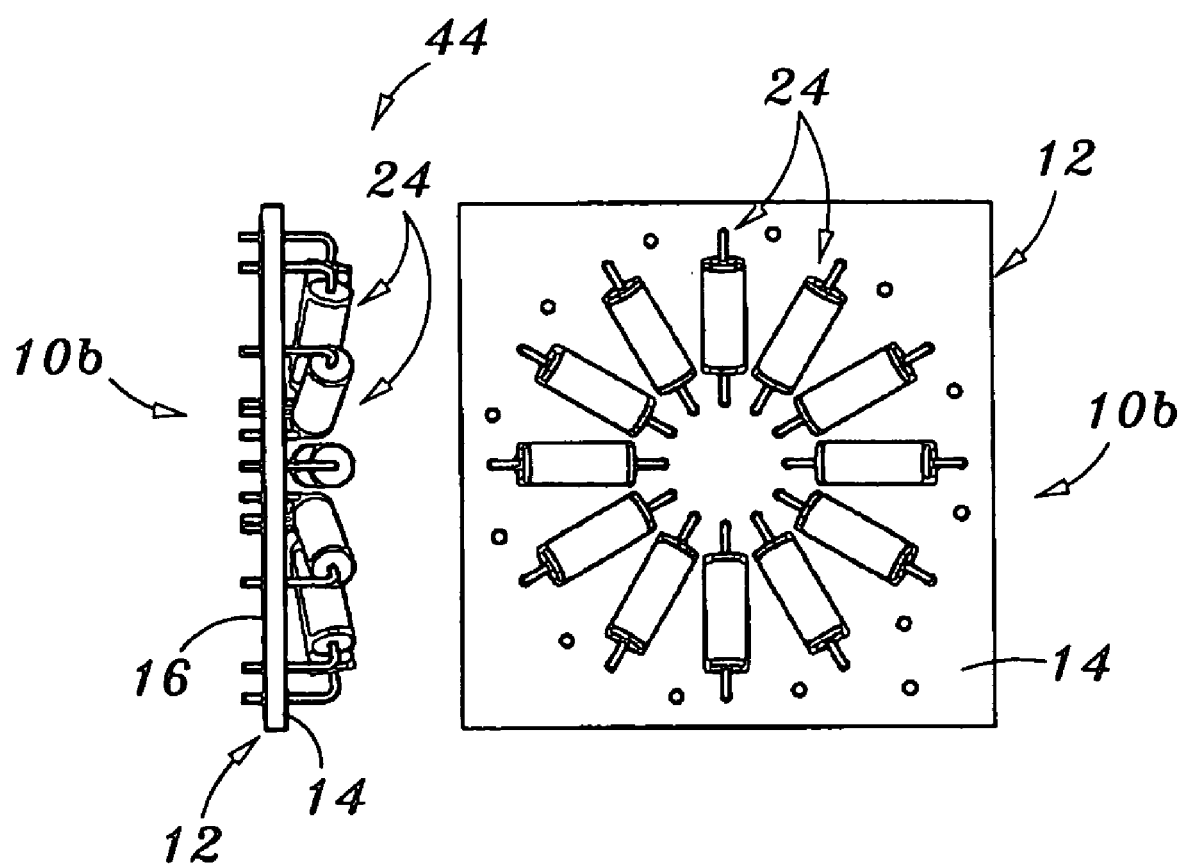
FIG. 21 is a side elevational view of the sensor of the fifth embodiment.
Figure 22:
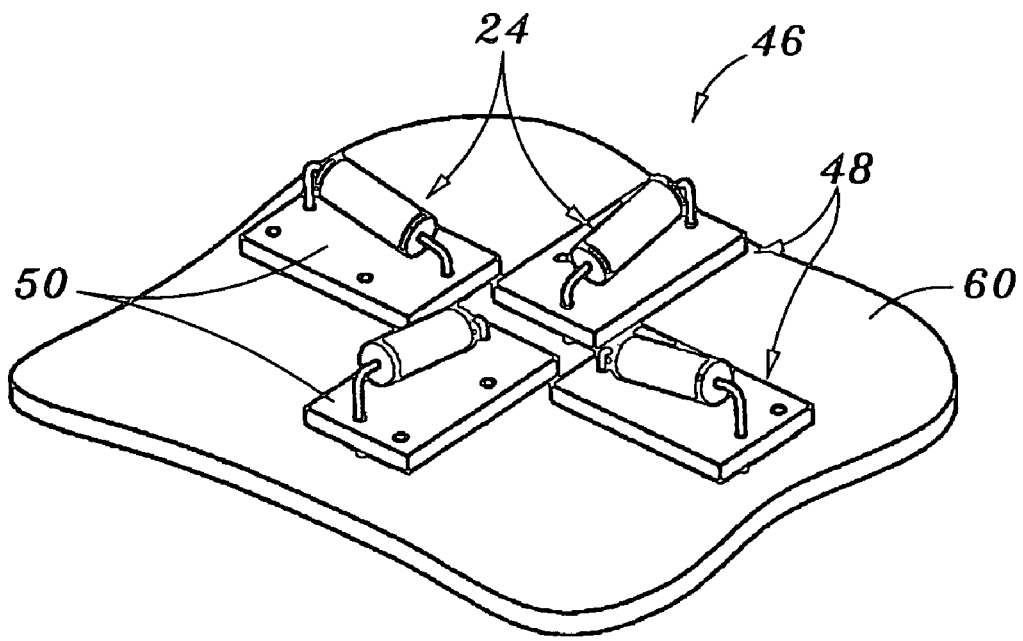
FIG. 22 is a top perspective view of a sensor constructed in accordance with a sixth embodiment of the present invention.
Figure 23:
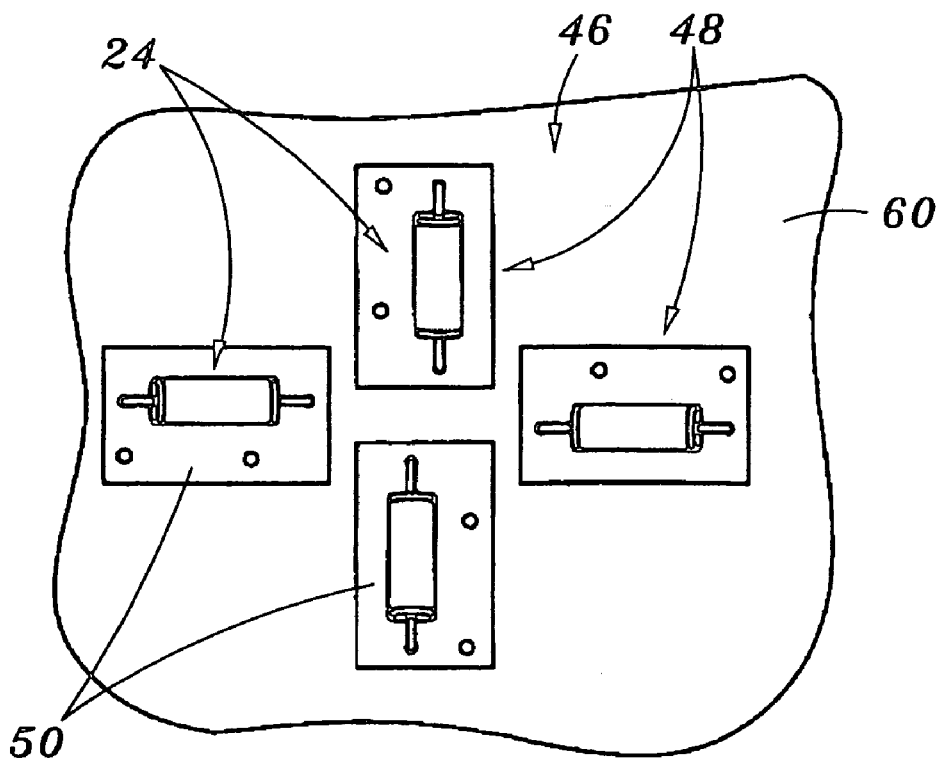
FIG. 23 is a top plan view of the sensor of the sixth embodiment.

Referring now to FIGS. 19-21, there is shown a sensor 44 constructed in accordance with a fifth embodiment of the present invention. Like the sensor 42, the sensor 44 is also actually an assembly consisting of a pair of the sensors 10*b* of the third embodiment placed in prescribed orientations relative to each other. More particularly, as is seen in FIGS. 19-21, the sensors 10*b* included in the sensor 44 are oriented relative to each other such that the base plate 12 of one of the sensors 10*b* extends generally perpendicularly relative to the base plate 12 of the remaining sensor 10*b*. As described above in relation to the other embodiments of the sensor, the electronic circuitry used in conjunction with the sensor 44 could be adapted to accommodate the numerous combinations of output signals which could be generated by the sensor 44. Though not shown, those of ordinary skill in the art will recognize that a sensor may be constructed including a pair of the sensors 10 of the first embodiment which are oriented relative to each other in the same manner as the sensors 10*b* of the sensor 44.

It is contemplated that in each of the above-described embodiments of the present invention, the switches 24 may be mounted to separate substrates (e.g., separate printed circuit boards), as opposed to groups of the switches 24 with the same respective orientation being mounted to a common substrate. More particularly, referring now to FIGS. 22-25, there is shown a sensor 46 constructed in accordance with a sixth embodiment of the present invention. Like the sensor 10 of the first embodiment described above, the sensor 46 includes four switches 24. However, the switches 24, rather than being attached to the common base plate as described in relation to the sensor 10, are attached to respective ones of four separate base members 48. Each of the base members 48 preferably has a generally quadrangular configuration. Each base member 48 further defines a generally planar top surface 50 and an opposed, generally planar bottom surface 52. Formed on the bottom surface 52 of each base member 48 is a conductive pattern 54 which may comprise one or more conductive pads and/or one or more conductive traces which is/are arranged in any one of a multiplicity of differently arranged patterns, the present invention not being limited to any prescribed pattern for the conductive pattern 54. The conductive pattern 54 is preferably fabricated from a conductive metallic material, such as copper. The formation of the conductive pattern 54 may be facilitated through the completion of a conventional etching process subsequent to the application of a metal layer to bottom surface 52 of the corresponding base member 48. Each base member 48 is preferably fabricated from a non-conductive, insulative material. Disposed with each base member 48 are multiple apertures 56 which extend through the base member 48 and prescribed portions of the conductive pattern 54 on the bottom surface 52 thereof.

Figure 24:
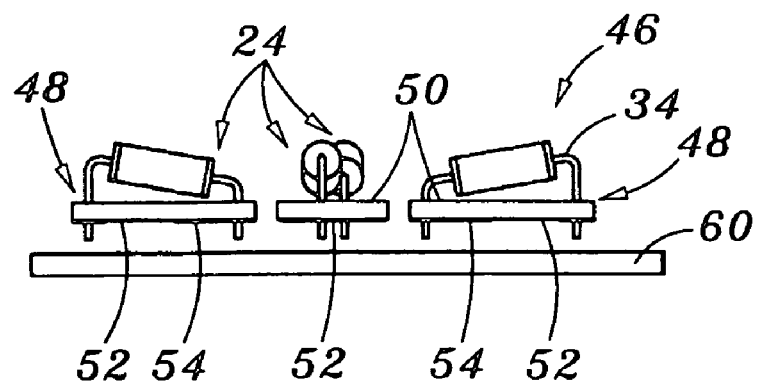
FIG. 24 is a side elevational view of the sensor of the sixth embodiment.
Figure 25:
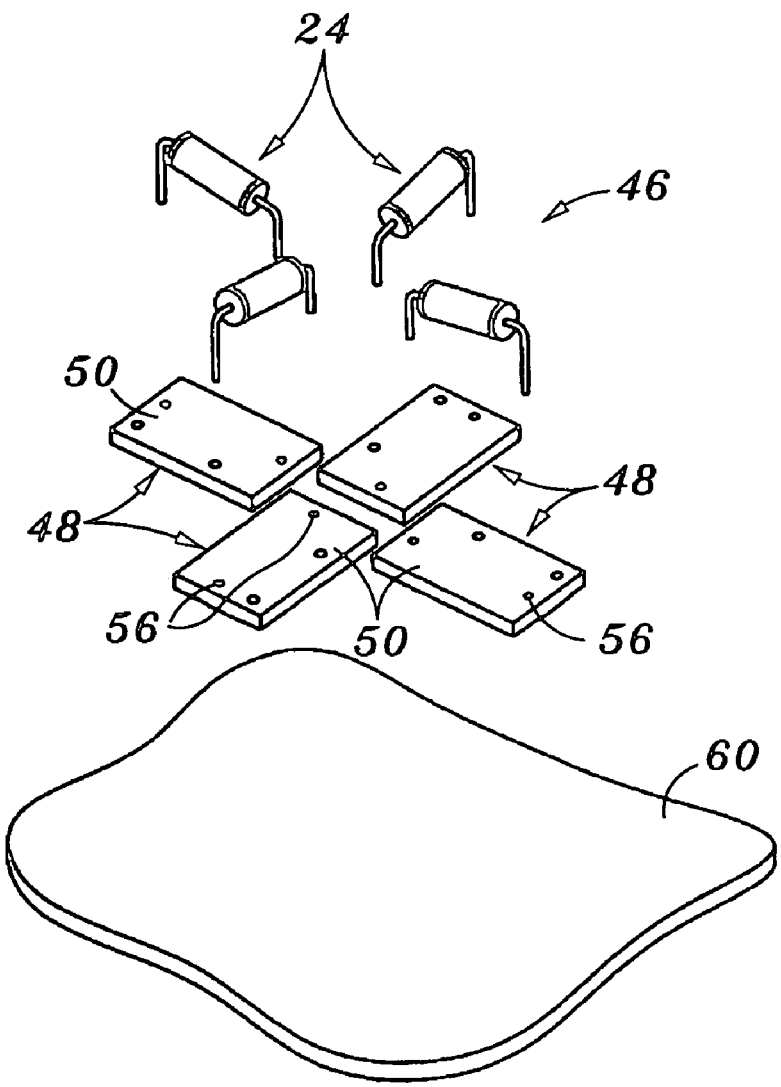
FIG. 25 is an exploded view of the sensor of the sixth embodiment.

In the sensor 46, each switch 24 is attached to a respective base member 48 such that that the stopper 29 is disposed closer to the top surface 50 than the plug 28, i.e., the plug 28 is slightly elevated relative to the top surface 50 of the base member 48 in the manner best shown in FIG. 24. To achieve this positioning, the pin portions 34, 35 of the first and second contact pins 30, 31 of each switch 24 are bent and advanced through respective, corresponding apertures 56 of the corresponding base member 48. In this regard, as also seen in FIG. 24, it is contemplated that the pin portion 34 of the first contact pin 30 will be bent to define an angle of less than about ninety degrees, with the pin portion 35 of the second contact pin 31 being bent to define an angle of more than about ninety degrees. Importantly, the pin portions 34, 35 of the first and second contact pins 30, 31, upon being advanced through respective ones of the apertures 56, are placed into electrical communication with the conductive pattern 54 on the bottom surface 52 of the base member 48. The pin portions 34, 35 are also secured to the conductive pattern 54 through the use of solder or a similar conductive metal in a manner maintaining the switch 24 in the elevated orientation relative to the top surface 50 described above wherein the body 26 of each switch 24 extends slightly angularly upwardly from the corresponding base member 48. It is contemplated that the angular elevation of the switch 24 may be any elevation greater than zero degrees, and may be specifically set or established to accomplish a prescribed function or result.

In the sensor 46 of the sixth embodiment, the separate base members 48 (which each include a switch 24 interfaced thereto in the above-described manner) are preferably attached to a common support or platform 60. Such platform 60 may actually comprise a toy or other device into which the sensor 46 is integrated. Those of ordinary skill in the art will recognize that the platform 60 need not necessarily be a unitary structure, but may consist of multiple structures which are interfaced to each other so as to concurrently move with each other. In this regard, all that is necessary is that the switches 24 and corresponding base members 48 always move concurrently when the toy or other device into which the sensor 46 is integrated is moved or shifted relative to a reference plane. The base members 48 are preferably attached to the platform 60 such that switches 24 are spaced from each other at intervals of approximately ninety degrees.

The sensor 46 of the sixth embodiment functions in essentially the same manner described above in relation to the sensor 10, the movement of the base members 48 out of parallel relation to a reference plane causing the actuation ball 36 of at least one of the switches 24 to roll away from the inner end 33 of the corresponding second contact pin 31 and into contact with the inner end 32 of the corresponding first contact pin 30. When such contact occurs, a closed circuit condition is created, such circuit being defined by the electrical connection of the pin portions 34, 35 of the first and second contact pins 30, 31 to the conductive pattern 54 of the corresponding base member 48, the conductive contact between the second contact pin 31 and the stopper 29, the conductive contact between the stopper 29 and the body 26, the conductive contact between the body 26 and the actuation ball 36, and the conductive contact between the actuation ball 36 and the inner end 32 of the first contact pin 30. Depending on the manner in which the base members 48 are tilted or shifted out of parallel relation to the reference plane, the actuation ball 36 of at least one of the switches 24 may be brought into conductive contact with a corresponding one of the first contact pins 30. Thus, the sensor 46, like the sensor 10, has the capability of generating a multiplicity of different conditions or states depending on the angular displacement of the platform 60 (and hence the base members 48) relative to the reference plane. When the platform 60 (and hence the base members 48) is in a neutral position and thus disposed in substantially parallel relation to the reference plane, no output signal is generated by the sensor 46 due to the absence of conductive communication between the actuation balls 36 and first contact pins 30. However, the shifting of the position of the platform 60 (and hence the base members 48) relative to the reference plane will cause one or more different output signals to be generated by the sensor 46, depending on which actuation ball(s) 36 are brought into conductive contact with the corresponding first contact pin(s) 30. The sensor 46 is preferably used in conjunction with electronic circuitry which has the functional capability of producing certain visual and/or audible effects and/or various signal transmissions, depending on which output signal(s) are transmitted thereto from the sensor 46.

Referring now to FIGS. 26-29, there is shown a sensor 46a constructed in accordance with a seventh embodiment of the present invention. The sensor 46a is similar in structure and function to the sensor 46 of the sixth embodiment described above. Thus, only the distinctions or variations between the sensors 46, 46a will be discussed below.

Figure 26:
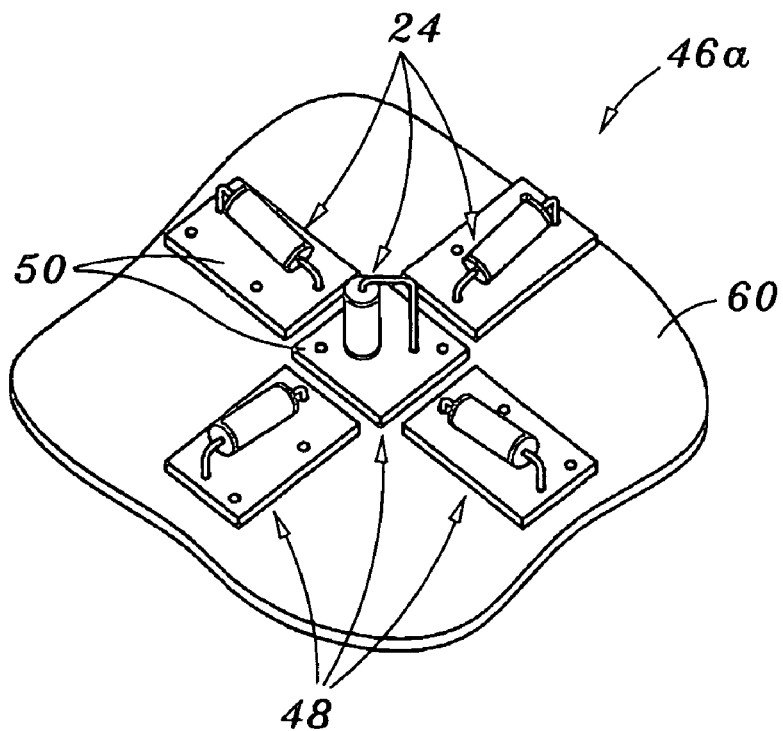
FIG. 26 is a top perspective view of a sensor constructed in accordance with a seventh embodiment of the present invention.
Figure 27:
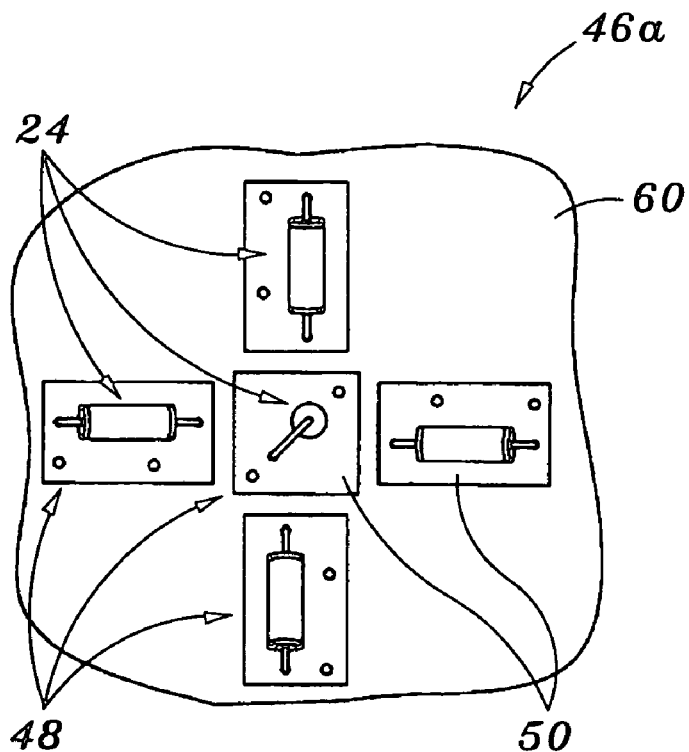
FIG. 27 is a top plan view of the sensor of the seventh embodiment.
Figure 28:
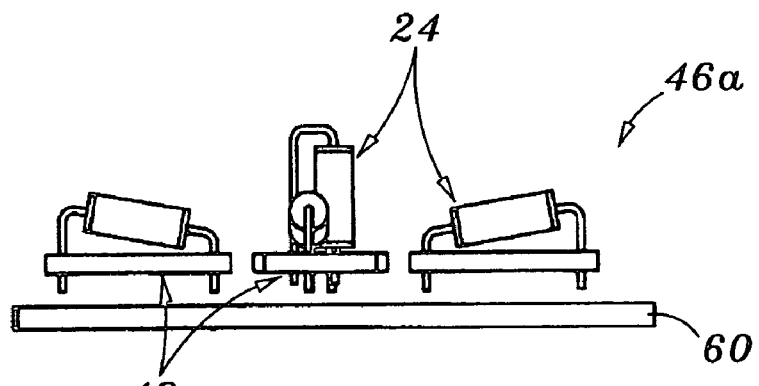
FIG. 28 is a side elevational view of the sensor of the seventh embodiment.
Figure 29:
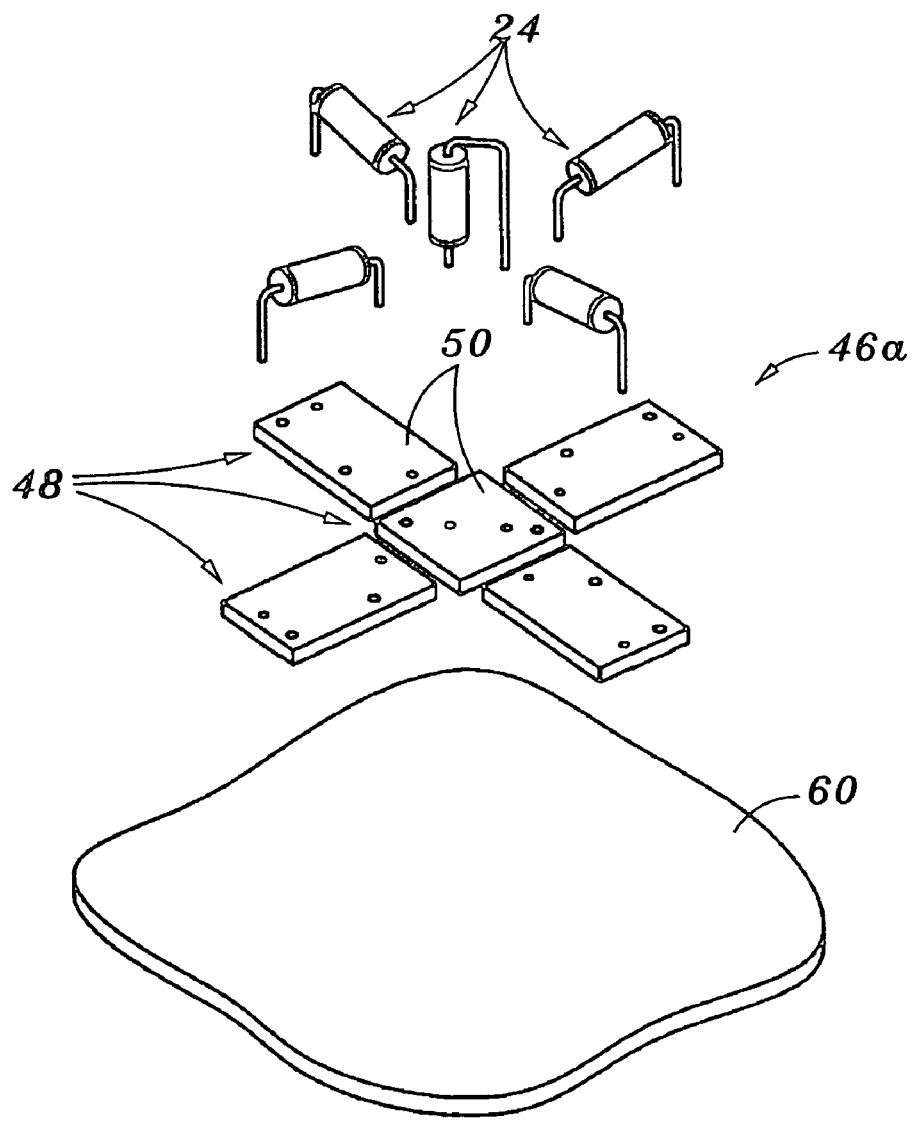
FIG. 29 is an exploded view of the sensor of the seventh embodiment.

The primary distinction between the sensor 46a of the seventh embodiment and the sensor 46 of the sixth embodiment is the inclusion of five switches 24 in the senor 46a, in comparison to the four switches 24 included in the sensor 46. In the sensor 46a, an extra fifth switch 24 is oriented so as to extend along an axis which itself extends generally perpendicularly relative to that surface of the platform 60 to which the base members 48 of the remaining four switches 24 are mounted. The fifth switch 24, like the remaining four switches 24, is mounted to its own base member 48. In the sensor 46a, the fifth switch 24 is mounted to its base member 48 such that the stopper 29 is disposed closer to the top surface 50 than the plug 28. As seen in FIGS. 26, 27 and 29, to accommodate the fifth switch 24 in the sensor 46a, the base members 48 of the remaining four switches 24 are spaced from each other to create a central gap or opening of sufficient size for the base member 48 of the fifth switch 24. However, those of ordinary skill in the art will recognize that the base member 48 of the fifth switch 24 need not necessarily be oriented between the remaining four base members 48.

The functionality of the sensor 46a of the seventh embodiment is similar to that described above in relation to the sensor 46 of the sixth embodiment. However, the sensor 46a, due to its inclusion of the fifth switch 24, has the additional capability of distinguishing whether the sensor 46a is right side up or upside down relative to a reference plane, in the same manner described above in relation to the functionality of the senor 10a of second embodiment.

Figure 30:
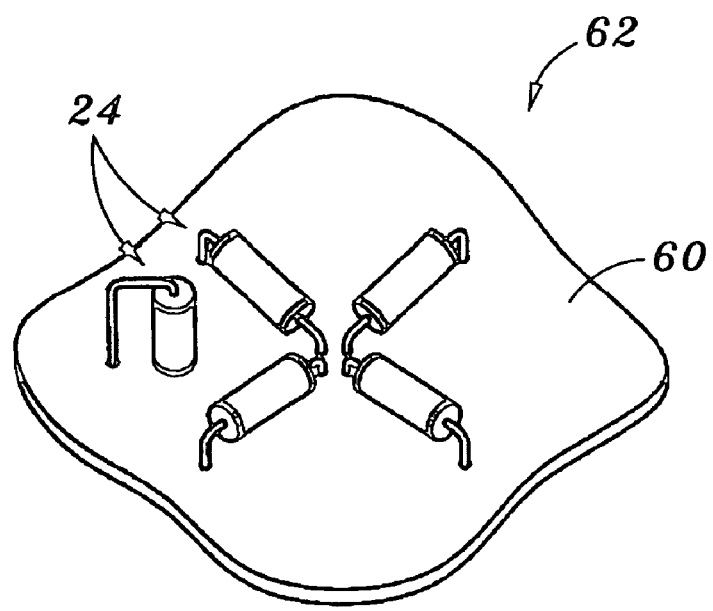
FIG. 30 is a top perspective view of a sensor constructed in accordance with an eighth embodiment of the present invention.
Figure 31:
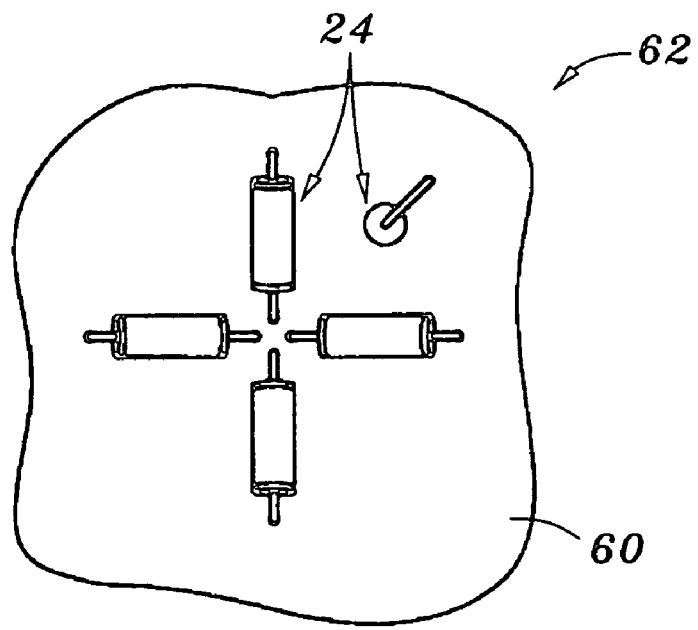
FIG. 31 is a top plan view of the sensor of the eighth embodiment.
Figure 32:
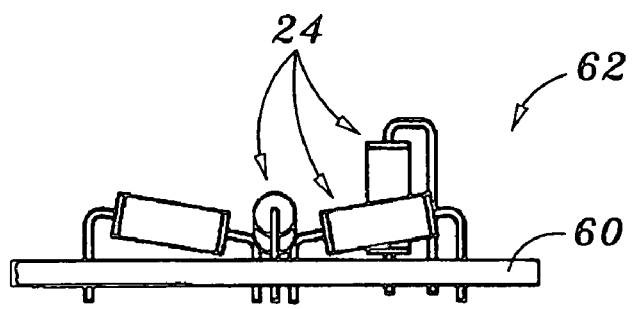
FIG. 32 is a side elevational view of the sensor of the eighth embodiment.
Figure 33:
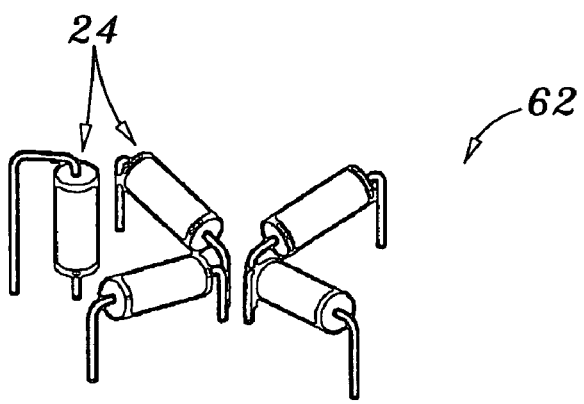
FIG. 33 is an exploded view of the sensor of the eighth embodiment.
Figure 33:
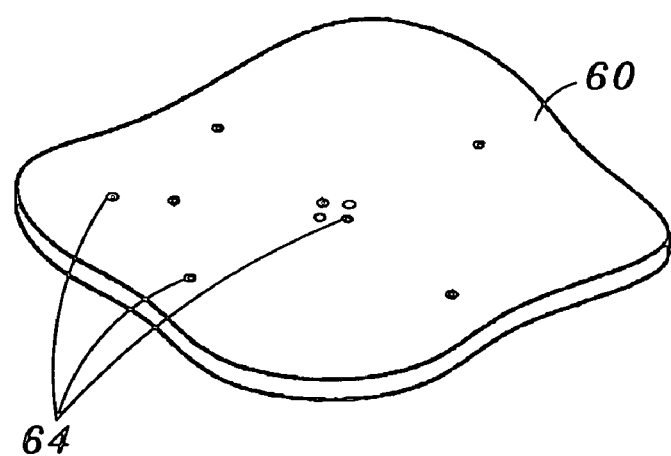
Figure 34:
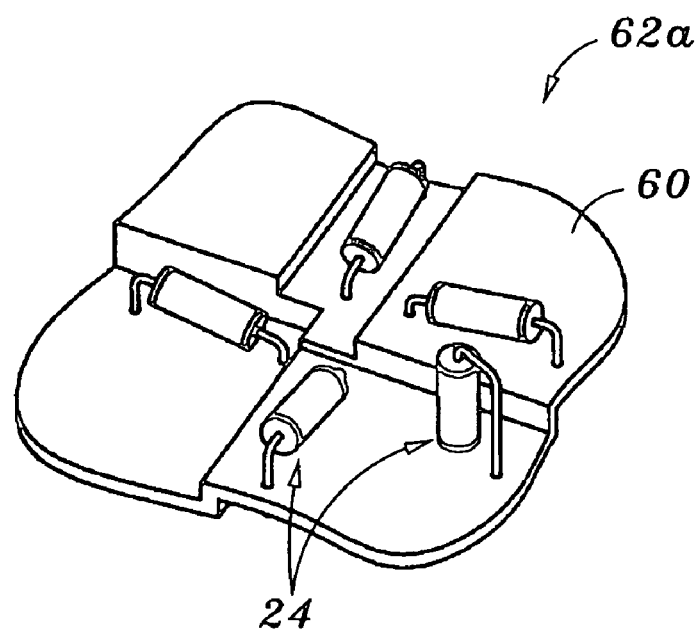
FIG. 34 is a top perspective view of a sensor constructed in accordance with a ninth embodiment of the present invention.
Figure 35:
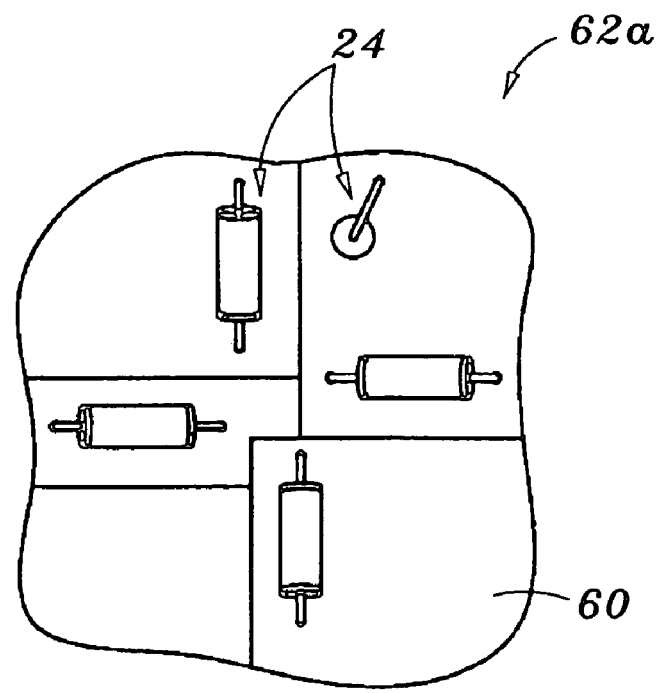
FIG. 35 is a top plan view of the sensor of the ninth embodiment.
Figure 36:
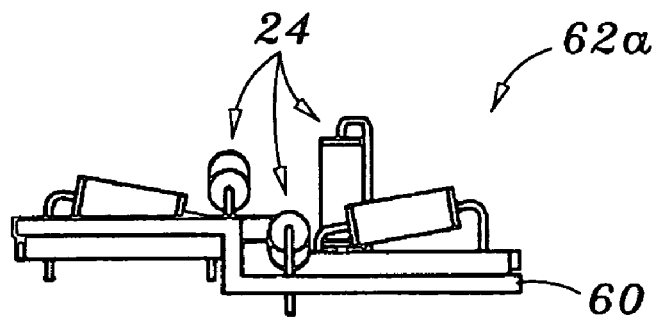
FIG. 36 is a side elevational view of the sensor of the ninth embodiment.
Figure 37:
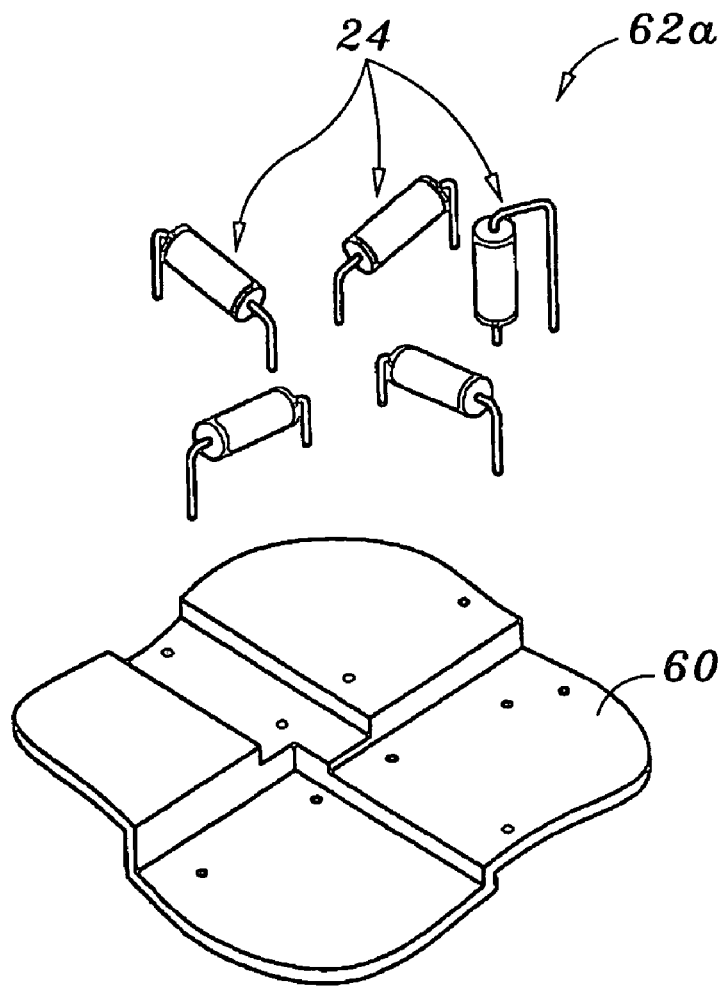
FIG. 37 is an exploded view of the sensor of the ninth embodiment.
Figure 38:
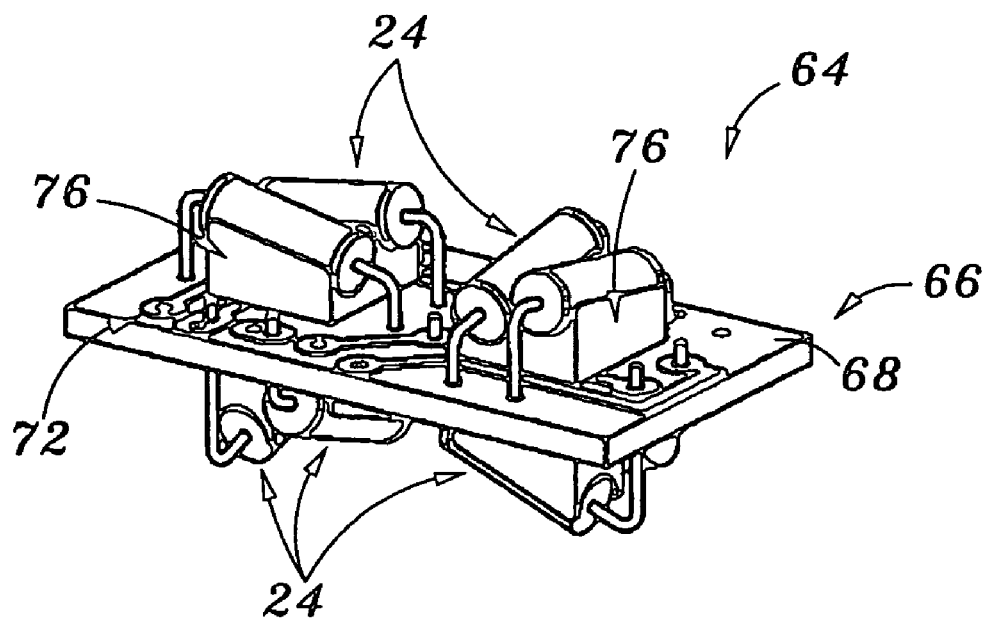
FIG. 38 is a top perspective view of a sensor constructed in accordance with a tenth embodiment of the present invention.
Figure 39:
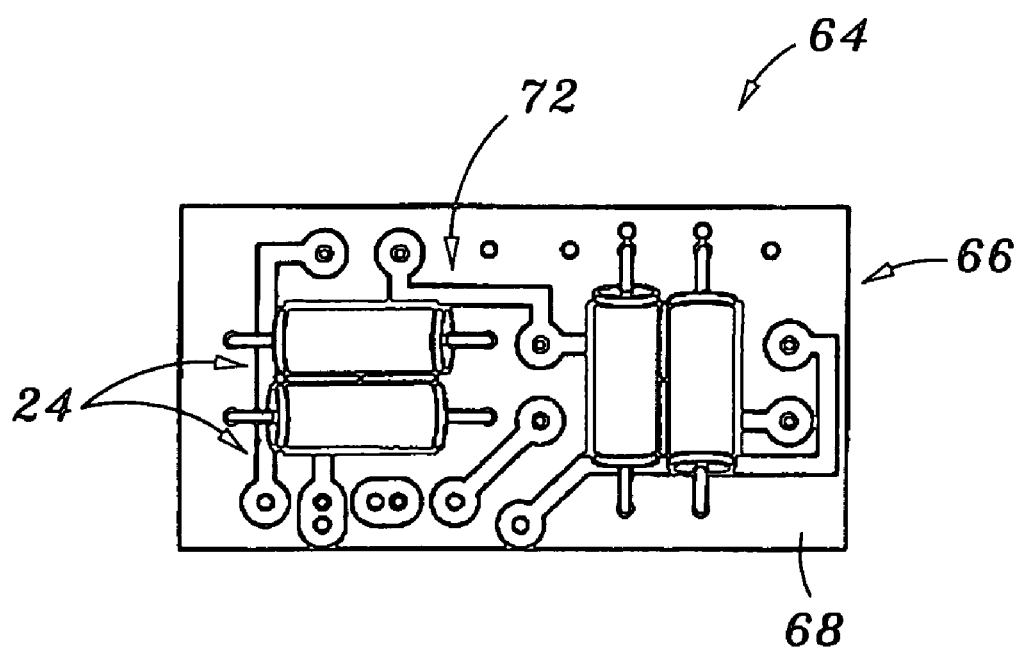
FIG. 39 is a top plan view of the sensor of the tenth embodiment.

Referring now to FIGS. 30-33, there is shown a sensor 62 constructed in accordance with an eighth embodiment of the present invention. The sensor 62 is similar to the sensor 46a of the seventh embodiment, except that the base members 48 of the sensor 46a are completely eliminated, the switches 24 of the sensor 62 being directly interfaced to a common surface of the platform 60. In this regard, as best seen in FIGS. 30 and 33, the first and second contact pins 30, 31 of each of the five switches 24 in the sensor 62 are advanced through respective, corresponding apertures 64 within the platform 60. Four of the switches 24 are oriented at intervals of approximately ninety degrees relative to each other, with the fifth switch 24 not being disposed between the remaining four switches 24, but rather outward thereof. Those of ordinary skill in the art will recognize that the switches 24 may be interfaced to the platform 60 at respective locations differing from those shown in FIGS. 30-33, and need not necessarily be located in close proximity to each other. The first and second contact pins 30, 31 of the switches 24 are further each electrically connected to a conductive pattern (not shown) which may be disposed on some portion of the platform 60 other than on the surface thereof upon which the switches are mounted. The conductive pattern may also be disposed on a remote printed circuit board or similar substrate, the first and second contact pins 30, 31 being electrically connected to such remote conductive pattern by wires or other suitable means. The functionality of the sensor 62 essentially mimics that of the sensor 10a of the second embodiment and the sensor 46a of the seventh embodiment.

Referring now to FIGS. 34-37, there is shown a sensor 62a constructed in accordance with a ninth embodiment of the present invention. The sensor 62a is similar in structure and function to the sensor 62 of the eighth embodiment described above. Thus, only the distinctions or variations between the sensors 62, 62a will be discussed below.

The only distinction between the sensor 62a of the ninth embodiment and the sensor 62 of the eighth embodiment is that in the sensor 62a, the five switches 24 are oriented at differing elevations relative to each other due to the lack or absence of a uniform, planar surface of the platform 60 to which all the switches 24 may be mounted. Despite these differing elevations, the functionality of the sensor 62a of the ninth embodiment mimics that of the sensor 62 of the eighth embodiment.

Referring now to FIGS. 38-41, there is shown a sensor 64 constructed in accordance with a tenth embodiment of the present invention. The sensor 64 comprises a base plate 66 (e.g., a printed circuit board) which has a generally quadrangular (e.g., rectangular) configuration. The base plate 66 defines a generally planar top surface 68 and an opposed, generally planar bottom surface 70. The base plate also includes a conductive pattern 72 which is disposed on the top and bottom surfaces 68, 70 thereof. The conductive pattern 72 which may comprise one or more conductive pads and/or one or more conductive traces which is/are arranged in any one of a multiplicity of differently arranged patterns, the present invention not being limited to any prescribed pattern for the conductive pattern 72. The conductive pattern 72 is preferably fabricated from a conductive metallic material, such as copper. The formation of the conductive pattern 72 may be facilitated through the completion of a conventional etching process subsequent to the application of a metal layers to each of the top and bottom surfaces 68, 70 of the base plate 66. Those portions of the conductive pattern 72 disposed on the top and bottom surfaces 68, 70 may be brought into selective electrical communication with each other through the use of conductive vias which extend through the base plate 66. The base plate 66 is itself preferably fabricated from a non-conductive, insulative material. Also disposed with the base plate 66 are a plurality of apertures 74 which extend through the base plate 66 and prescribed portions of the conductive pattern 72 on the top and bottom surfaces 68, 70 thereof.

The sensor 64 of the tenth embodiment further comprises a plurality (e.g., eight) of the above-described tubular switches 24. In the sensor 64, the switches 24 are segregated in four sets of two switches 24, each pair or set of the switches 24 being interfaced to a respective one of four switch holders 76 included in the sensor 64. Each of the switch holders 76 is formed to define an adjacent pair of elongate, downwardly sloping, semi-cylindrical recesses which are sized and configured to accommodate respective ones of the switches 24 in the manner shown in FIGS. 38-41. The recesses of each switch holder 76 do not slope downwardly in the same direction, but rather in opposite directions. In assembling the sensor 64, two of the switch holders 76 are secured to the top surface 68 of the base plate 66, with the remaining two switch holders 76 being secured to the bottom surface 70 thereof. Within each of the two switch holders 76 secured to the top surface 68 of the base plate 66, the corresponding switches 24 are oriented such that the stoppers 29 thereof are each disposed closer to the top surface 68 than the plugs 28, i.e., the open end of the body 26 of each switch 24 which is enclosed by the plug 28 is disposed at a higher elevation relative to the top surface 68 as compared to the open end of the body 26 enclosed by the stopper 29. In contrast, similar to the discussion above in relation to the sensor 10, within each of the two switch holders 76 secured to the bottom surface 70 of the base plate 66, the corresponding switches 24 are oriented such that the plugs 28 thereof are each disposed closer to the bottom surface 70 than the stoppers 29, i.e., the open end of the body 26 of each switch 24 which is enclosed by the stopper 29 is disposed at a higher elevation relative to the bottom surface 70 as compared to the open end of the body 26 enclosed by the plug 28.

As indicated above, within each switch holder 76, the switches 24 slope in opposite directions due to the orientation of the adjacent recesses. In the exemplary configuration of the sensor 64 shown in FIGS. 38-41, each of the two switch holders 76 secured to the top surface 68 of the base plate 66 is configured such that each of the two switches 24 disposed therein slope at angle of approximately ten degrees relative to the top surface 68, albeit in opposite directions. At the same time, each of the two switch holders 76 secured to the bottom surface 70 of the base plate 66 is configured such that each of the two switches 24 disposed therein slope at angle of approximately twenty degrees relative to the bottom surface 70, albeit in opposite directions. However, it is further contemplated that the switch holders 76 may each be formed such that the pair of switches 24 therein will extend at differing slopes or angles. For example, in a switch holder 76 attached to the top surface 68, one switch 24 of the corresponding pair may extend at an angle of approximately ten degrees relative to the top surface 68, with the remaining switch 24 of the pair extending at an angle of greater or less than ten degrees relative to the top surface 68. Still further, the switch holders 76 may also be configured such that all the switches 24 extend at approximately the same angle relative to respective ones of the top and bottom surfaces 68, 70 of the base plate 66. Those of ordinary skill in the art will recognize that any such angles of elevation may be specifically set or established to accomplish a prescribed function or result. Further, as is also seen in FIGS. 38-41, the switch holders 76 attached to the top surface 68 are preferably oriented relative to each other such that the switches 24 within one extend generally perpendicularly relative to the switches 24 in the other, i.e., one switch holder 76 attached to the top surface 68 is rotated approximately ninety degrees relative to the other. Similarly, the switch holders 76 attached to the bottom surface 70 are preferably oriented relative to each other such that the switches 24 within one extend generally perpendicularly relative to the switches 24 in the other, i.e., one switch holder 76 attached to the bottom surface 70 is rotated approximately ninety degrees relative to the other.

The pin portions 34, 35 of the first and second contact pins 30, 31 of each switch 24 of the sensor 64 are bent as needed to facilitate the advancement thereof through respective, corresponding apertures 74 of the base plate 12 when mounted to respective ones of the switch holders 76. Importantly, the pin portions 34, 35 of the first and second contact pins 30, 31, upon being advanced through respective ones of the apertures 74, are each placed into electrical communication with the conductive pattern 72 of the base plate 66. The pin portions 34, 35 may be secured to the conductive pattern 72 through the use of solder or a similar conductive metal. The switches 24 are effectively maintained in the above-described elevated orientations relative to the top and bottom surfaces 68, 70 by the underlying switch holders 76.

Due to the manner in which the switches 24 are interfaced to the base plate 66 as described above, the bodies 26 of the switches 24 are each placed into electrical communication with the conductive pattern 72 via respective ones of the stoppers 29 and second contact pins 31. The first contact pins 30 are also each placed into electrical communication with the conductive pattern 72 in the above-described manner. Within each switch 24, the actuation ball 36 is in conductive contact with the body 26 and selectively placeable into conductive contact with either the inner end 32 of the first contact pin 30 or the inner end 33 of the second contact pin 31.

Figure 40:
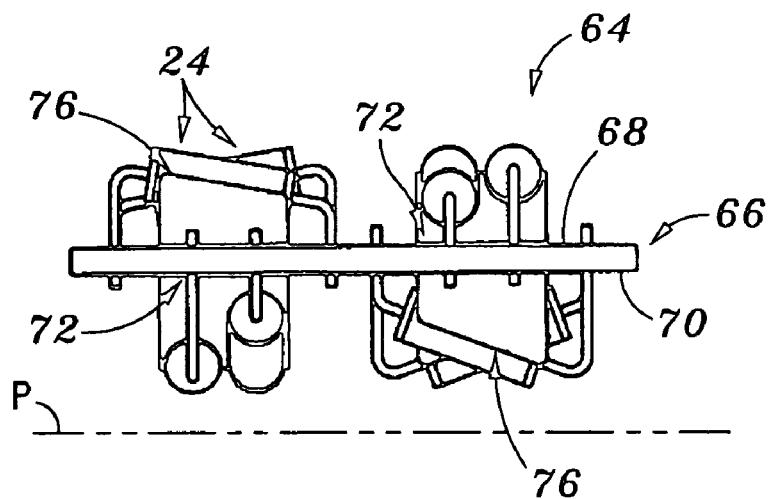
FIG. 40 is a side elevational view of the sensor of the tenth embodiment.
Figure 41:
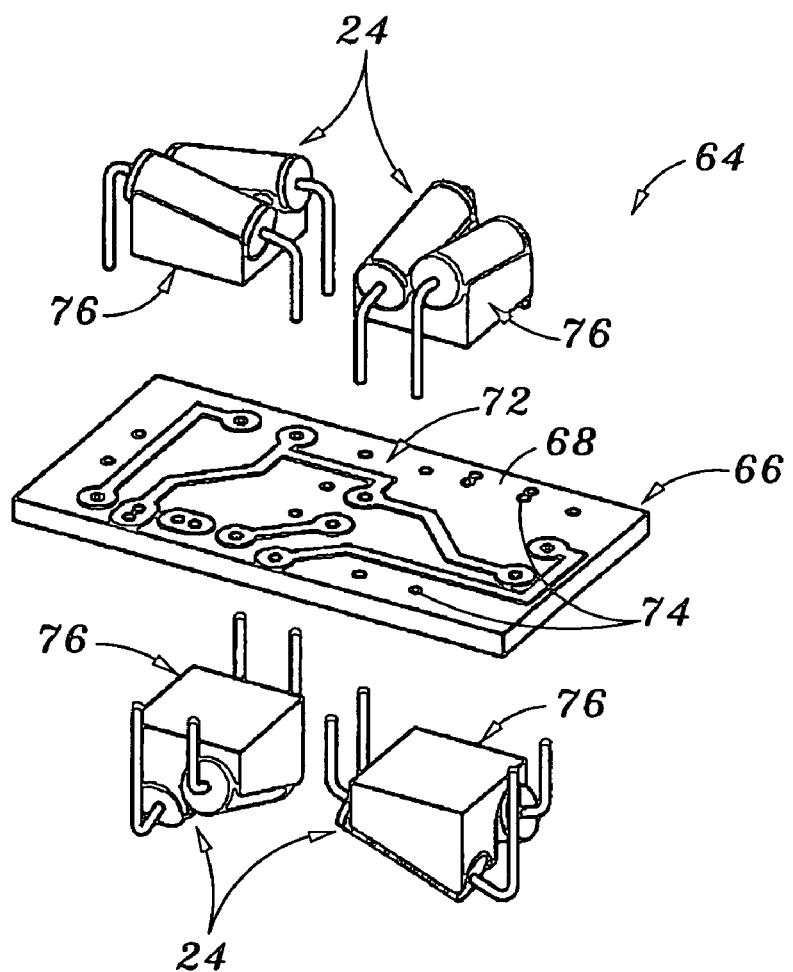
FIG. 41 is an exploded view of the sensor of the tenth embodiment.

In the sensor 64, each switch 24 is selectively placeable into either an open circuit or a closed circuit condition, i.e., an on or off state. When the sensor 64 is oriented such that the base plate 66 extends in spaced, generally parallel relation to a reference plane P as shown in FIG. 40, the actuation ball 36 of each switch 24 will roll or move into contact with the inner end 33 of the corresponding second contact pin 31. The movement of each actuation ball 36 into contact with a respective inner end 33 occurs as a result of the angular inclination of each body 26 as described above. In this neutral position wherein the actuation balls 36 are all disposed against the inner ends 33 of the second contact pins 31, an open circuit condition is created as a result of the gap between each actuation ball 36 and the inner end 32 of the corresponding first contact pin 30 which is electrically isolated from the body 26 due to the advancement of the pin portion 34 thereof through an insulator (i.e., the corresponding plug 28).

As will be recognized, the movement of the sensor 64 so as to cause the base plate 66 to be shifted out of parallel relation to the reference plane P will cause the actuation ball 36 of at least one of the switches 24 to roll away from the inner end 33 of the corresponding second contact pin 31 and into contact with the inner end 32 of the corresponding first contact pin 30. When such contact occurs, a closed circuit condition is created, such circuit being defined by the electrical connection of the pin portions 34, 35 of the first and second contact pins 30, 31 to the conductive pattern 72, the conductive contact between the second contact pin 31 and the stopper 29, the conductive contact between the stopper 29 and the body 26, the conductive contact between the body 26 and the actuation ball 36, and the conductive contact between the actuation ball 36 and the inner end 32 of the first contact pin 30.

As will be recognized, depending on the manner in which the base plate 66 is tilted or shifted out of parallel relation to the reference plane P, the actuation balls 36 of two or more of the switches 24 may be brought into conductive contact with corresponding ones of the first contact pins 30 at the same time. Thus, as will be recognized, the sensor 64 has the capability of generating a multiplicity of different conditions or states depending on the angular displacement of the base plate 66 relative to the reference plane P. In this regard, two or more of such conditions or states may be generated at the same time depending on the angular displacement of the base plate 66 relative to the reference plane P. When the base plate 66 is in its neutral position and thus disposed in substantially parallel relation to the reference plane P, no output signal is generated by the sensor 64 due to the existence of the open circuit conditions attributable to the separation between the actuation balls 36 and the first contact pins 30. However, the shifting of the position of the base plate 66 relative to the reference plane P will cause one or more different output signals to be generated by the sensor 64, depending on which actuation ball(s) 36 are brought into conductive contact with the corresponding first contact pin(s) 30. In this regard, the sensor 64 may itself be used in conjunction with electronic circuitry 78 shown in FIG. 42 which has the functional capability of producing certain visual and/or audible effects, depending on which output signal(s) are transmitted thereto from the sensor 64. It is contemplated that such electronic circuitry 78 will be programmable, and may be programmed to produce a selected effect upon a prescribed sequence of output signals being transmitted thereto from the sensor 10. As indicated above, the sensor 64 and the complimentary electronic circuitry 78 may be integrated into any one of a multiplicity of different interactive devices, one such exemplary device being an interactive toy.

Though not shown, it is contemplated that each switch 24 may alternatively be configured to include more than one actuation ball 36. The inclusion of more than one actuation ball 36 within the body 26 of each switch 24 provides more weight, which in turn assists in the movement of the actuation balls 36 toward a corresponding first contact pin 30 upon the movement of the base plate 66 out of parallel relation to the reference plane P. Further, in the sensor 64, either the two switch holders 74 (and thus the four switches 24) attached to the top surface 68, or the two switch holders 74 (and thus the four switches 24) attached to the bottom surface 70, may be omitted. Additionally, one or more of the switch holders 74 included in the sensor 64 may be modified so as to accommodate only a single switch 24, as opposed to a pair of switches 24. Still further, those of ordinary skill in the art will recognize that the non-circular arrangement of the switches 24 relative to both the top and bottom surfaces 68, 70 of the base plate 66 in the sensor 64 as shown in FIGS. 38-41 may also be applied to other embodiments of sensor, including for example the first embodiment shown in FIGS. 1-4. In this regard, the switches 24 in any embodiment of the sensor may be arranged relative to each in any one of a multiplicity of different configurations, the particular arrangements/configurations shown and described herein being exemplary only. Moreover, in any embodiment of the sensor, including the sensor 64, the switches 24 may be electrically connected to a remote conductive pattern (e.g., a portion of a remote printed circuit board) which is not part of an adjacent base plate or platform through the use of conductive wires or other suitable means.

Additional modifications and improvements of the present invention may also be apparent to those of ordinary skill in the art. Thus, the particular combination of parts described and illustrated herein is intended to represent only certain embodiments of the present invention, and is not intended to serve as limitations of alternative devices within the spirit and scope of the invention.

What is claimed is:

1. A sensor for use in an interactive electronic device, the sensor comprising:
    a base plate having a conductive pattern disposed thereon; and
    at least two switches attached to the base plate, each of the switches being electrically connected to the conductive pattern and comprising:
        a conductive tubular body electrically connected to the conductive pattern and defining an interior chamber;
        at least one conductive actuation member disposed in the interior chamber; and
        a conductive first contact pin electrically connected to the conductive pattern and having a portion which resides in the interior chamber;
        the actuation member being selectively placeable into simultaneous electrical contact with the body and the first contact pin;
    the sensor being operative to generate different output signals corresponding to respective positions of the base plate relative to a reference plane, each of the output signals being generated by the creation of a closed or open circuit condition by at least one of the switches.

2. The sensor of claim 1 wherein:
    four switches are attached to a common side of the base plate at intervals of approximately ninety degrees; and
    each of the switches is electrically connected to the conductive pattern of the base plate.

3. The sensor of claim 1 wherein:
    twelve switches are attached to a common side of the base plate at intervals of approximately thirty degrees; and
    each of the switches is electrically connected to the conductive pattern of the base plate.

4. The sensor of claim 1 wherein:
    the base plate defines at least one generally planar plate surface; and
    at least one of the switches is oriented so as to extend along a switch axis which extends generally perpendicularly relative to the plate surface.

5. The sensor of claim 4 wherein:
    four switches are attached to a common side of the base plate at intervals of approximately ninety degrees;

a fifth switch is attached to the common side of the base plate and oriented so as to extend along the switch axis; and each of the switches is electrically connected to the conductive pattern of the base plate.

6. The sensor of claim 1 wherein:

the tubular body of each of the switches has opposed open ends;

a non-conductive plug is attached to the body of each of the switches and encloses one of the open ends thereof;

a conductive stopper is attached to the body of each of the switches and encloses one of the open ends thereof, the body, the plug and the stopper collectively defining the interior chamber;

the first contact pin extends through the plug; and each of the switches further includes a second contact pin which is attached to the stopper;

the first and second contact pins, the stopper, the body and the actuation ball each being fabricated from a conductive metal material, the body and the second contact pin each being electrically connected to the stopper, with portions of the first and second contact pins each being electrically connected to the conductive pattern.

7. The sensor of claim 6 wherein:

the base plate defines a generally planar plate surface; and each of the switches is attached to the plate surface such that the body thereof is angularly oriented relative thereto.

8. A sensor assembly for use in an interactive electronic device, the sensor assembly comprising:

a first sensor comprising:
 a first base plate defining a generally planar first plate surface and including a first conductive pattern disposed thereon;
 four switches attached to the first plate surface at intervals of approximately ninety degrees; and
 a fifth switch attached to the first plate surface and oriented so as to extend along a switch axis which extends generally perpendicularly relative to the first plate surface;
 each of the switches of the first sensor being electrically connected to the first conductive pattern;

a second sensor comprising:
 a second base plate defining a generally planar second plate surface and including a second conductive pattern disposed thereon; and
 four switches attached to the second plate surface at intervals of approximately ninety degrees, each of the switches of the second sensor being electrically connected to the second conductive pattern;

the second base plate of the second sensor being offset at an angle of approximately forty five degrees relative to the first base plate of the first sensor such that the four switches of each of the first and second sensors are oriented at intervals of approximately forty five degrees relative to each other, the sensor assembly being operative to generate different output signals corresponding to respective positions of the first and second base plates relative to a reference plane, each of the output signals being generated by the creation of a closed or open circuit condition by at least one of the switches.

9. The sensor assembly of claim 8 wherein the switches of the first and second sensors each comprise:

a tubular body having opposed open ends;

a non-conductive plug attached to the body and enclosing one of the open ends thereof;

a conductive stopper attached to the body and enclosing one of the open ends thereof, the body, the plug and the stopper collectively defining an interior chamber;

at least one actuation ball disposed in the interior chamber;

a first contact pin extending through the plug, a portion of the first contact pin residing in the interior chamber; and a second contact pin attached to the stopper;

the first and second contact pins, the stopper, the body and the actuation ball each being fabricated from a conductive metal material, the body and the second contact pin each being electrically connected to the stopper, with portions of the first and second contact pins each being electrically connected to a respective one of the first and second conductive patterns, the actuation ball being selectively placeable into simultaneous electrical contact with the body and the first contact pin.

10. The sensor assembly of claim 8 wherein:

the four switches of each of the first and second sensors are attached to respective ones of the first and second plate surfaces such that the bodies thereof are angularly oriented relative thereto.

11. A sensor assembly for use in an interactive electronic device, the sensor assembly comprising:

a first and second sensors which each comprise:
 a base plate defining a generally planar plate surface and including a conductive pattern disposed thereon;
 a plurality of switches attached to the plate surface at prescribed intervals, each of the switches being electrically connected to the conductive pattern;

the plate surface of the base plate of the second sensor extending generally perpendicularly relative to the plate surface of the base plate of the first sensor, the sensor assembly being operative to generate different output signals corresponding to respective positions of the first and second base plates relative to a reference plane, each of the output signals being generated by the creation of a closed or open circuit condition by at least one of the switches.

12. The sensor assembly of claim 11 wherein twelve switches are attached to the plate surface at intervals of approximately thirty degrees, each of the switches being electrically connected to the conductive pattern.

13. The sensor assembly of claim 11 wherein the switches of the first and second sensors each comprise:

a tubular body having opposed open ends;

a non-conductive plug attached to the body and enclosing one of the open ends thereof;

a conductive stopper attached to the body and enclosing one of the open ends thereof, the body, the plug and the stopper collectively defining an interior chamber;

at least one actuation ball disposed in the interior chamber;

a first contact pin extending through the plug, a portion of the first contact pin residing in the interior chamber; and a second contact pin attached to the stopper;

the first and second contact pins, the stopper, the body and the actuation ball each being fabricated from a conductive metal material, the body and the second contact pin each being electrically connected to the stopper, with portions of the first and second contact pins each being electrically connected to a respective one of the conductive patterns, the actuation ball being selectively placeable into simultaneous electrical contact with the body and the first contact pin.

14. The sensor assembly of claim 11 wherein:

the switches of each of the first and second sensors are attached to respective ones of the plate surfaces such that the bodies thereof are angularly oriented relative thereto.

15. A sensor for use in an interactive electronic device, the sensor comprising:
a platform; and
at least two switches attached to the platform, each of the switches being electrically connected to a conductive pattern and comprising:
a conductive tubular body electrically connected to the conductive pattern and defining an interior chamber;
at least one conductive actuation member disposed in the interior chamber; and
a conductive first contact pin electrically connected to the conductive pattern and having a portion which resides in the interior chamber;
the actuation member being selectively placeable into simultaneous electrical contact with the body and the first contact pin;
the sensor being operative to generate different output signals corresponding to respective positions of the platform relative to a reference plane, each of the output signals being generated by the creation of a closed or open circuit condition by at least one of the switches.

16. The sensor of claim 15 wherein the platform comprises a portion of the interactive electronic device.

17. The sensor of claim 16 wherein the switches reside on respective ones of at least two generally parallel planes defined by the platform.

18. The sensor of claim 15 wherein each of the switches is attached to the platform so as to extend at a prescribed angular orientation relative thereto.

19. A sensor for use in an interactive electronic device, the sensor comprising:
at least two base members, each of the base members having a conductive pattern disposed thereon; and
at least two switches attached to respective ones of the base members, each of the switches being electrically connected to a respective one of the conductive patterns and comprising:
a conductive tubular body electrically connected to a respective one of the conductive patterns and defining an interior chamber;
at least one conductive actuation member disposed in the interior chamber; and
a conductive first contact pin electrically connected to a respective one of the conductive patterns and having a portion which resides in the interior chamber;
the actuation member being selectively placeable into simultaneous electrical contact with the body and the first contact pin;
the base members of the sensor being attached to a common platform, with the sensor being operative to generate different output signals corresponding to respective positions of the platform relative to a reference plane, each of the output signals being generated by the creation of a closed or open circuit condition by at least one of the switches.

20. The sensor of claim 19 wherein the platform comprises a portion of the interactive electronic device.

21. The sensor of claim 19 wherein each of the switches is attached to a respective one of the base members so as to extend at a prescribed angular orientation relative thereto.

22. A sensor for use in an interactive electronic device, the sensor comprising:
a base plate having opposed top and bottom surfaces and a conductive pattern disposed thereon; and
at least two switch holders attached to the base plate, each of the switch holders including at least one switch disposed thereon, each of the switches being electrically connected to the conductive pattern and comprising:
a conductive tubular body electrically connected to the conductive pattern and defining an interior chamber;
at least one conductive actuation member disposed in the interior chamber; and
a conductive first contact pin electrically connected to the conductive pattern and having a portion which resides in the interior chamber;
the actuation member being selectively placeable into simultaneous electrical contact with the body and the first contact pin;
the sensor being operative to generate different output signals corresponding to respective positions of the base plate relative to a reference plane, each of the output signals being generated by the creation of a closed or open circuit condition by at least one of the switches.

23. The sensor of claim 22 wherein the at least two switch holders are attached to one of the top and bottom surfaces of the base plate.

24. The sensor of claim 23 wherein each of the switch holders is sized and configured to maintain the switch disposed thereon at a prescribed angle relative to one of the top and bottom surfaces of the of the base plate.

25. The sensor of claim 23 wherein at least two switch holders are attached to the top surface of the base plate and at least two switch holders attached to the bottom surface of the base plate, each of the switch holders including at least two switches disposed thereon, each of the switches being electrically connected to the conductive pattern.

26. The sensor of claim 25 wherein each of the switch holders is sized and configured to maintain each of the switches disposed thereon at a prescribed angle relative to a respective one of the top and bottom surfaces of the of the base plate.

27. The sensor of claim 26 wherein each of the switch holders is sized and configured to maintain each of the switches disposed thereon at respective ones of first and second different prescribed angles relative to a respective one of the top and bottom surfaces of the base plate.

28. The sensor of claim 25 wherein:
the switch holders attached to the top surface are preferably oriented relative to each other such that one of the switch holders attached to the top surface is rotated approximately ninety degrees relative to the other one of the switch holders attached to the top surface; and
the switch holders attached to the bottom surface are oriented relative to each other such that one of the switch holders attached to the bottom surface is rotated approximately ninety degrees relative to the other one of the switch holders attached to the bottom surface.

29. The sensor of claim 23 wherein the switch holders attached to one of the top and bottom surfaces are preferably oriented relative to each other such that one of the switch holders is rotated approximately ninety degrees relative to the other one of the switch holders.

* * * * *